(12) United States Patent
Ibe et al.

(10) Patent No.: US 7,591,071 B2
(45) Date of Patent: Sep. 22, 2009

(54) MANUFACTURING METHOD OF SEMICONDUCTIVE ELEMENT AND INK JET HEAD SUBSTRATE

(75) Inventors: Satoshi Ibe, Yokohama (JP); Teruo Ozaki, Yokohama (JP); Ichiro Saito, Yokohama (JP); Sakai Yokoyama, Kawasaki (JP); Kenji Ono, Tokyo (JP); Kazuaki Shibata, Kawasaki (JP); Toshiyasu Sakai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 405 days.

(21) Appl. No.: 11/340,467

(22) Filed: Jan. 27, 2006

(65) Prior Publication Data

US 2006/0170734 A1 Aug. 3, 2006

(30) Foreign Application Priority Data

Jan. 31, 2005 (JP) ............................. 2005/023716

(51) Int. Cl.
*B21D 53/76* (2006.01)
*H01L 21/70* (2006.01)

(52) U.S. Cl. .................... 29/890.1; 29/846; 29/417; 438/21; 438/460; 438/694; 438/700

(58) Field of Classification Search ............... 29/890.1, 29/611, 25.35, 846, 412, 417; 361/764, 774; 438/21, 33, 460, 465, 694, 696, 700, 702
See application file for complete search history.

(56) References Cited

U.S. PATENT DOCUMENTS

| 5,081,474 | A | | 1/1992 | Shibata et al. |
|---|---|---|---|---|
| 5,491,505 | A | | 2/1996 | Suzuki et al. |
| 5,606,198 | A | * | 2/1997 | Ono et al. ............... 361/764 X |
| 6,402,302 | B1 | | 6/2002 | Ozaki et al. |
| 6,443,563 | B1 | | 9/2002 | Saito et al. |
| 6,450,617 | B1 | | 9/2002 | Kitani et al. |
| 6,497,477 | B1 | | 12/2002 | Nakamura et al. |
| 6,513,911 | B1 | | 2/2003 | Ozaki et al. |
| 6,609,783 | B1 | | 8/2003 | Koyama et al. |

(Continued)

FOREIGN PATENT DOCUMENTS

JP 63242653 A * 10/1988 ............... 29/611 X (Continued)

*Primary Examiner*—A. Dexter Tugbang
(74) *Attorney, Agent, or Firm*—Fitzpatrick, Cella, Harper & Scinto

(57) ABSTRACT

A semiconductor device includes a lateral end surface and a connection electrode for external electrical connection. The connection electrode is exposed at the side surface. A manufacturing method of the semiconductor device includes steps of forming a linear recess in a silicon substrate between adjacent semiconductor devices, forming, on an inner surface of the recess, the electrode for external electrical connection of one of the semiconductor devices, and a step of separating the one semiconductor device from another on the silicon substrate by cutting the silicon substrate along the linear recess. Forming the electrode includes steps of forming a metal thin film astride a cutting line at which the silicon substrate is to be cut, forming a resist layer and patterning the resist layer on the metal thin film, growing metal at a portion not having the patterned resist layer, and removing the patterned resist layer and the metal thin film below the patterned resist layer. The connection electrode is provided by the metal grown in the growing step.

4 Claims, 18 Drawing Sheets

U.S. PATENT DOCUMENTS

| | | | |
|---|---|---|---|
| 6,907,656 B1 * | 6/2005 | Saita et al. | 29/890.1 X |
| 2003/0209772 A1 * | 11/2003 | Prabhu | 438/33 X |
| 2006/0033780 A1 | 2/2006 | Ono et al. | |
| 2007/0211115 A1 | 9/2007 | Ibe et al. | |

FOREIGN PATENT DOCUMENTS

| | | |
|---|---|---|
| JP | 05-283271 | 10/1993 |
| JP | 2000-351208 | 12/2000 |

* cited by examiner (a)

(b)

(a)

(b)

MANUFACTURING METHOD OF SEMICONDUCTIVE ELEMENT AND INK JET HEAD SUBSTRATE

FIELD OF THE INVENTION AND RELATED ART

The present invention relates to a semiconductive element, a semiconductive element usable as the substrate for an ink jet recording head, and a manufacturing method therefor.

It has been a common practice to employ a silicon wafer as a substrate for a semiconductive element. One of the structural arrangements for making electrical connection between a semiconductive element formed on a substrate formed of silicon (which hereinafter will be referred to simply as silicon substrate), and an external component, has been as shown in FIG. 27(c). More specifically, a semiconductive element 101 is provided with a ball bump 103, which is formed on a connective electrode 102. Thus, the electrical connection was made between this ball bump 103 and an electrically conductive external member 104. As for the method for forming the connective electrode 102 for establishing electrical connection between the semiconductive element 101 and the electrically conductive external member 104, usually, a film of $SiO_2$, a film of an oxide, a film of electrically insulating film, etc., are formed on a substrate 105 formed of silicon, and then, a layer of aluminum wiring is formed thereon. Then, a surface protecting film, for example, a film of tantalum or the like, is formed thereon. Thereafter, the aluminum wiring layer is exposed by creating a hole (holes) through the surface protective film by photolithographic patterning technologies.

As the semiconductive element 101 is mounted into a specific position in an apparatus, electrical connection is established between this connective electrode 102 and the electrically conductive external member 104, such as TAB (Tape Automated Bonding) through the ball bump 103 ball-bonded to the connective electrode 102. The ball bump 103 is formed by adapting the wire-bonding method. More specifically (although not illustrated), a piece of wire is put through a so-called capillary, or a piece of ceramic tube, so that it slightly projects from the capillary. Then, the projecting portion of the wire is formed into a ball by arc discharge. The thus formed ball is welded to a specific portion of the connective electrode 102 on the substrate, with ultrasonic waves or the combination of ultrasonic waves and heat. After the welding, the capillary is lifted, and the wire is pulled with a cutting damper by clamping the wire with the cutting clamper. As a result, the wire becomes separated from the ball due to the tensional stress, leaving the ball attached to the connective electrode. This is how the ball bump 103 has been formed on the silicon substrate 105.

As the method for making connection between the ball bump 103 and the lead wire or the like of the electrically conductive external member 104, there are the single-point bonding, gang bonding, etc. The gang bonding is a bonding method for bonding all at once multiple inner leads to the ball bump 102. In the past, the single-point bonding has been the common method for connecting the semiconductive element 101. Thus, when obtaining multiple semiconductive elements 101 using a single piece of silicon wafer 105, the silicon wafer 105 is cut by a dicing apparatus along the scribe lines (cutting lines) of the wafer 105 to separate the multiple semiconductive elements 101 on the wafer 105 into individual pieces, as shown in FIG. 27(b). The thus obtained semiconductive element 101 is connected to the electrically conductive external member or the like by die bonding.

As described above, when making electrical connection between the connective electrode 102 of the semiconductive element 101 and electrically conductive external member or the like with the use of the ball bonding method, normally, the stud bump bonding method has been used, which mechanically forms the connective electrode 102, because the number of the connective electrodes 102, with which each semiconductive element 101 is provided, has been relatively small. However, the stud bump bonding method suffers from the following problems. First, the space necessary for forming the ball bump 103 on the aluminum wire layer on the silicon substrate 105 must be secured on the surface of the silicon substrate 105, making it necessary to increase the semiconductive element 101 in size. Therefore, it is possible that the number of the semiconductive elements 101 manufacturable on a single wafer will be reduced. Secondly, it takes a certain number of steps to form the ball bump 103 on the connective electrode 102, not only increasing the number of the steps required to manufacture the semiconductive element 101, but also complicating the process for manufacturing the semiconductive element 101.

For the purpose of further increasing the number of the semiconductive elements 101 manufacturable on a single piece of wafer, various attempts have been made to more efficiently use the space on the surface of the single piece of wafer. For example, attempts have been made to improve the microscopic processing methods so that the semiconductive elements 101 can be formed at a higher density, or to make it possible for each wire to be shared for multiple purposes. However, any of the abovementioned methods which increase the level of density at which the semiconductive elements 101 can be formed per unit surface of a single piece of wafer has its own limit in terms of the number of the semiconductive elements 101 manufacturable on a single piece of wafer. Further, in the case of a conventional structural arrangement for connecting two semiconductive elements (101) different in function, more specifically, a conventional structural arrangement for connecting a driving chip and another chip, which are independently manufactured, their connective portions take up a large amount of space. Therefore, the conventional connective structural arrangement cannot be said to be as effective as desired in terms of spatial efficiency, that is, it is not as effective as desired, for increasing the density level at which the semiconductive elements are disposed.

As an example of an industrial product which uses a semiconductive element, Japanese Laid-open Patent Application 2000-351208 discloses an ink jet head, which uses a semiconductive element as a driver IC, and in which the electrical connection is made with the use of bonding wires. In the case of the structural arrangement of this ink jet head, however, in order to prevent the driver IC from interfering with the ink ejection, the driver IC must be mounted on the back side of the main assembly of the ink jet head. In other words, this structural arrangement requires the driver IC to be positioned on the specific side of the semiconductive element. Also, it requires a certain number of bonding steps such as those required of a semiconductive element in accordance with the prior art. Therefore, this structural arrangement also cannot be said to be as simple and excellent in spatial efficiency as desired.

There are ink jet heads structured so that the semiconductive element 101 itself is used as the substrate for an ink jet head as shown in FIG. 28. These ink jet heads are formed on a silicon substrate 105. They comprise an ink channel 106, a heat generating resistor 107 for generating ink ejection energy, and an ink ejection orifice 108, which are formed on the silicon substrate 105. It also comprises the connective electrode 102 which is connected to the flexible substrate or the like of an external component, to supply the heat generating resistor 107 with electrical signals and/or electric power. This kind of structural arrangement also suffers from problems similar to those described above. That is, it increases an ink jet head substrate in size, possibly decreasing the number of the ink jet heads formable on a single piece of wafer. It also takes a certain number of steps to form the ball bump 103 on the connective electrode 102, not only increasing the number of the steps required to manufacture the ink jet head, but also complicating the process for manufacturing the ink jet head. Incidentally, in the case of the structural arrangement shown in FIG. 28, the area in which the connective electrode 102, the ball bump 103, and the lead portion of the electrically conductive external member 104 are connected is protected by a seal 109.

SUMMARY OF THE INVENTION

The primary object of the present invention is to provide a semiconductive element which is simple in the process of forming its connective electrode for establishing electrical connection between it and an external component, low in manufacturing cost, higher in the density level at which it can be formed on a single piece of substrate, and greater in spatial efficiency, and also, a method for manufacturing such a semiconductive element. Another object of the present invention is to provide an ink jet head substrate comprising such a semiconductive element, and a method for manufacturing such an ink jet head substrate.

Another object of the present invention is to provide a semiconductive element, the connective electrode of which for establishing electrical connection between it and an external component is exposed from one of its lateral surfaces.

According to an aspect of the present invention, there is provided a semiconductor device comprising a lateral end surface; and a connection electrode for external electrical connection, said connection electrode is exposed at said side surface.

According to another aspect of the present invention, there is provided an ink jet head comprising a substrate for an ink jet head, said substrate including energy generating means for generating energy for ejecting ink, an interconnection layer for electrical connection between said energy generating means and said connection electrode, an ink ejection outlet disposed corresponding to said energy generating means, and an ink flow path; and a connection electrode for external electrical connection, said connection electrode is exposed at said side surface of said ink jet head substrate.

According to a further aspect of the present invention, there is provided a manufacturing method for manufacturing semiconductor devices by cutting a silicon substrate having semiconductor devices, said method comprising a step of forming a linear recess between adjacent semiconductor devices; an electrode forming step of forming, on an inner surface of said recess, an electrode for external electrical connection of said semiconductor device; and a step of separating said semiconductor device from said silicon substrate by cutting said silicon substrate along the linear recess.

According to a further aspect of the present invention, there is provided a manufacturing method for manufacturing an ink jet head wherein an ink jet head structure is formed on a semiconductor device provided by cutting a silicon substrate, said manufacturing method comprising providing semiconductor devices formed on the silicon substrate with energy generating means for generating energy for ejecting ink, an interconnection layer for electrical connection between said energy generating means and said connection electrode, an ink ejection outlet disposed corresponding to said energy generating means, and an ink flow path; a step of forming a linear recess in a surface of said silicon substrate between adjacent said semiconductor devices; an electrode forming step of forming, on an inner surface of said recess, an electrode for external electrical connection of said semiconductor device; and a step of cutting said silicon substrate along said linear recess to separate said semiconductor devices from said silicon substrate and to expose electrodes on a cut surface.

These and other objects, features, and advantages of the present invention will become more apparent upon consideration of the following description of the preferred embodiments of the present invention, taken in conjunction with the accompanying drawings.

DETAILED DESCRIPTION OF THE PREFERRED EMBODIMENTS

Hereinafter, the preferred embodiments of the present invention will be described with reference to the appended drawings; they are in the form of an ink jet head comprising a semiconductive element having the function of ejecting ink.

Embodiment 1

Figure 1:
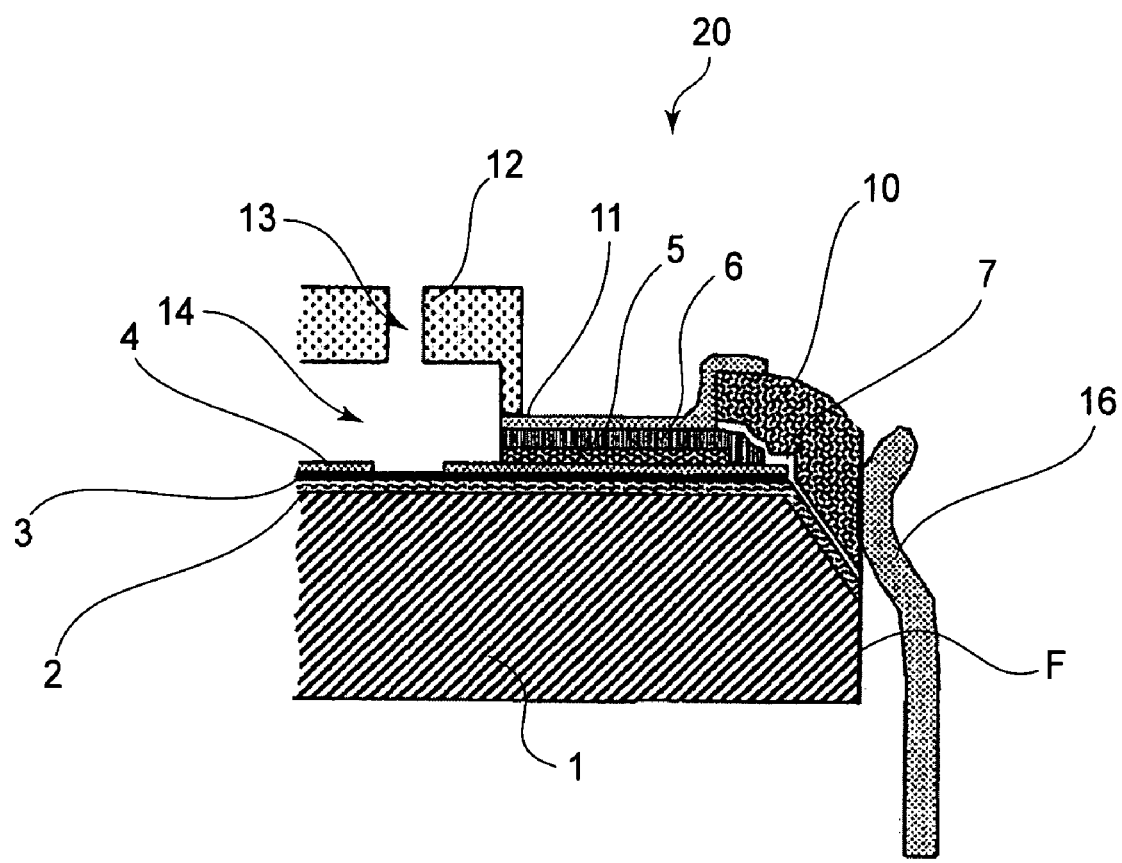
FIG. 1 is a sectional view of the essential portions of the semiconductive element in the first embodiment of the present invention.

Shown in FIG. 1 are the essential portions of the semiconductive element 20 in the first embodiment of the present invention. The semiconductive element 20 is obtained by forming multiple semiconductive elements on a single piece of wafer, and then, dicing the wafer. It constitutes the substrate for an ink jet head. The semiconductive element 20 is provided with an electrically connective portion 10 (connective electrode), which is exposed at one of the lateral surfaces, that is, one of the outermost lateral surfaces F, of the semiconductive element 20. When obtaining the semiconductive element 20 by dicing a wafer after forming multiple semiconductive elements on the wafer, the outermost lateral surfaces F of the semiconductive element 20 are the surfaces which result as the wafer is diced. In this embodiment, it is to this connective electrode 10 that an electrically conductive external member, for example, a flexible print substrate, TAB (Tape Automated Bonding) lead 16, etc., is connected.

Figure 2:
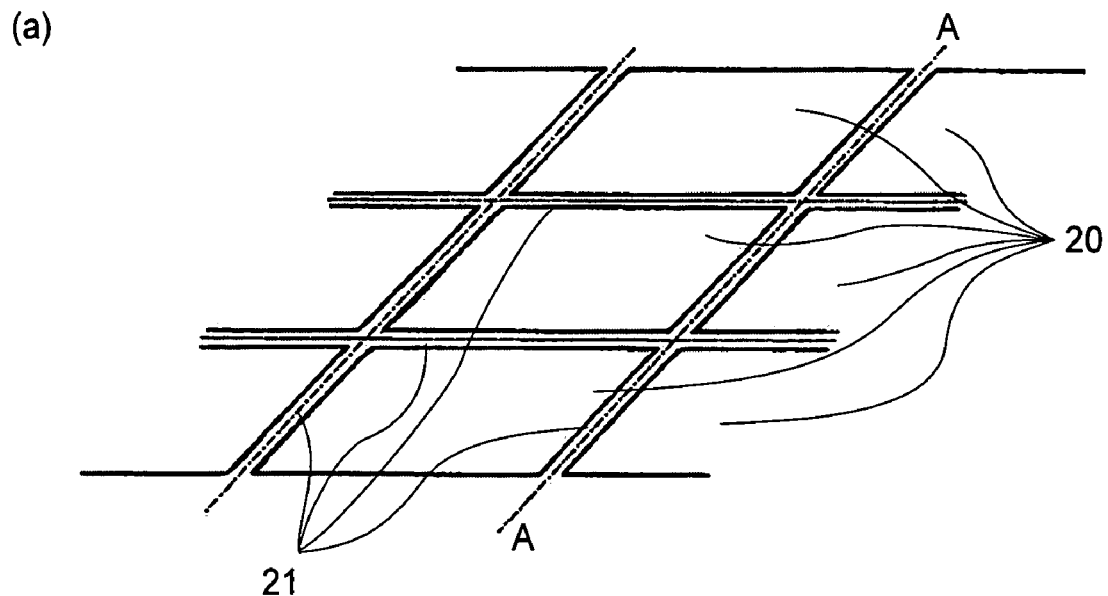
FIG. 2(a) is a schematic perspective view of the grooves, with which a silicon substrate is provided, and along which the silicon substrate is cut when the semiconductive element shown in FIG. 1 is formed.
FIG. 2(b) is a schematic perspective view of the through-holes, with which a silicon substrate is provided in order to make it easier to cut the silicon substrate when forming the semiconductive element shown in FIG. 1.
Figure 2:
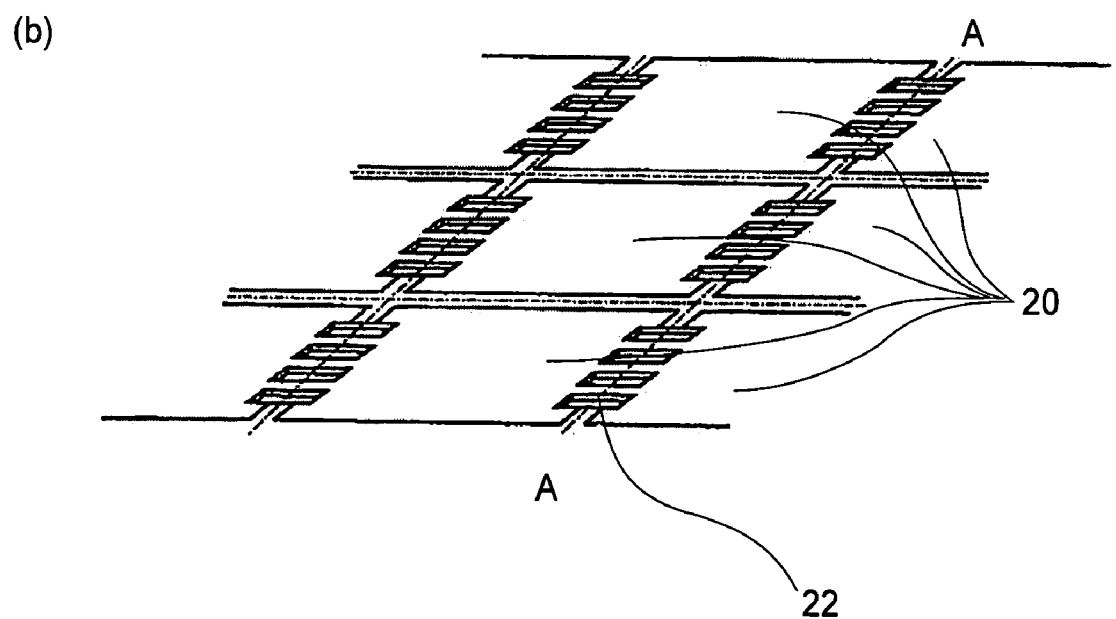
Figure 3:
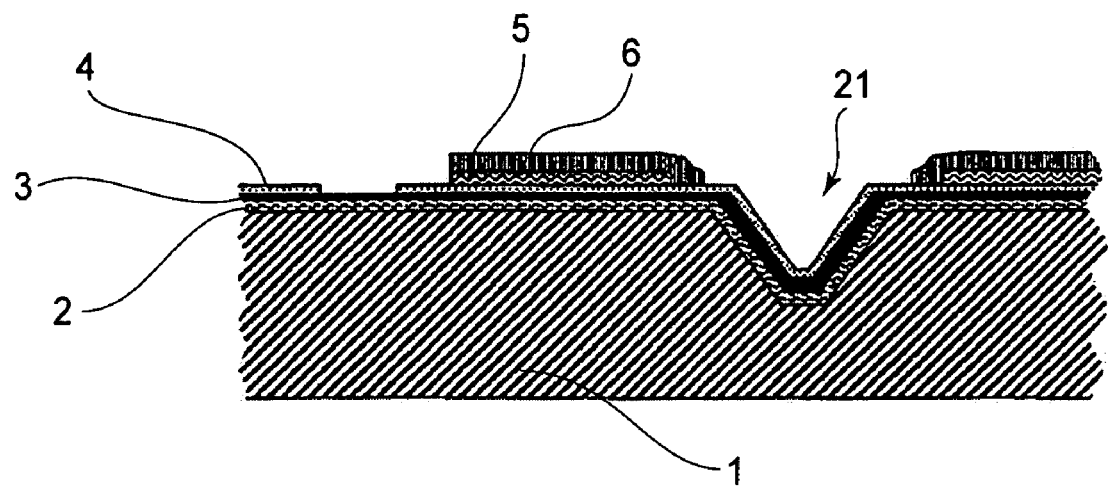
FIG. 3 is a sectional view of the precursor of the semiconductive element shown in FIG. 1, showing the beginning steps of the manufacturing process of the semiconductive element.

The following is an example of the method for manufacturing this semiconductive element 20. In this embodiment, first, multiple semiconductive elements 20 are formed on a single wafer as shown in FIG. 2. Then, the wafer is diced along the scribe lines A (cutting lines) to obtain multiple individual semiconductive elements 20. The silicon substrate 1 used in this embodiment is formed of a single crystal of silicon, the index of plane of which is preferably (100). It is electrically nonconductive across its surfaces. Although not shown in the drawing, a mask having a specific pattern is formed of resist or the like, on the silicon substrate 1. Then, the silicon substrate 1 is dipped in etching liquid for a preset length of time to anisotropically etch the silicon substrate 1 (wet etching). Then, the etching liquid is washed away from the silicon substrate 1, and the mask is removed from the substrate 1, obtaining the silicon substrate 1 having grooves 21 recesses or with the V-shaped cross section, which coincide with the scribe lines A (cutting lines) between the semiconductive elements 20 on the silicon substrate 1 as shown in FIGS. 2 and 3. The slanted surfaces of each of these grooves 21, on which the connective electrode 10 is formed, have an angle of roughly 50° relative to the top surface of the silicon substrate 1 as shown in FIG. 3.

Incidentally, instead of the grooves 21, through-holes 22 which coincide with the scribe lines (A) may be cut through the silicon substrate 1 as shown in FIG. 2.

Referring to FIG. 3, next, an electrically nonconductive separation film layer 2, heat generating resistor layer 3 (ejection energy generating means), an aluminum wiring layer 4, an electrically nonconductive separation film layer 5, and a protective film layer 6 are sequentially formed in layers on the silicon substrate 1, with the use of a thin film depositing method such as the vacuum evaporation method; they are formed in specific patterns with the use of the photolithography.

Figure 4:
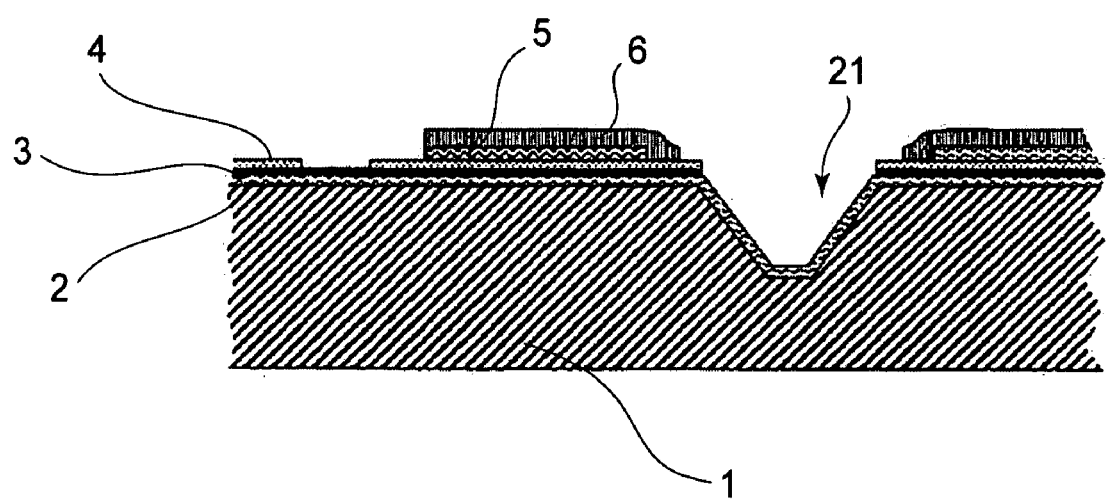
FIG. 4 is a sectional view of the precursor of the semiconductive element shown in FIG. 1, showing the semiconductive element manufacturing step following the step shown in FIG. 3.

Next, referring to FIG. 4, the portions of the aluminum wiring layer 4, which are in the grooves 21 coinciding with the scribe lines A, and the portion of the heat generating resistor layer 3, which is in the grooves 21 coinciding with the scribe lines A, are removed by the etching process which uses a patterned mask formed of resist.

Figure 5:
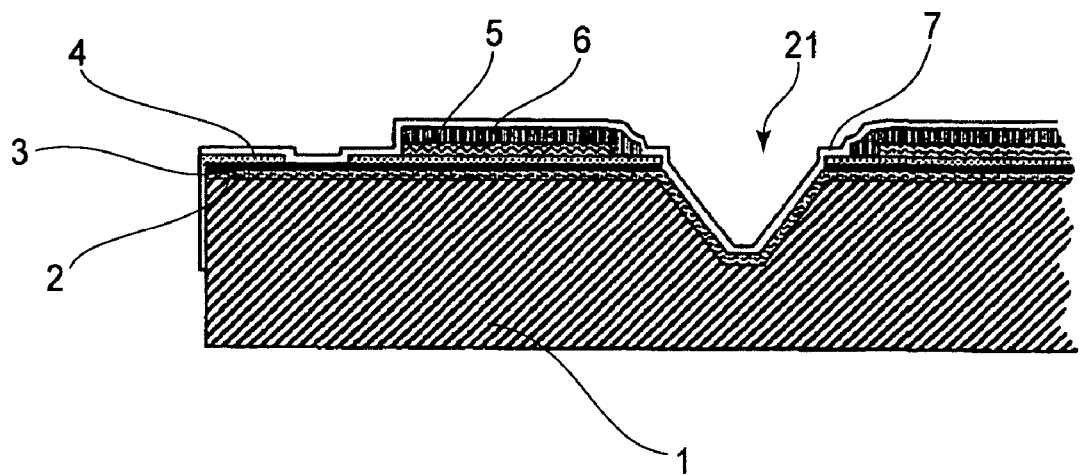
FIG. 5 is a sectional view of the precursor of the semiconductive element shown in FIG. 1, showing the semiconductive element manufacturing step following the step shown in FIG. 4.
Figure 6:
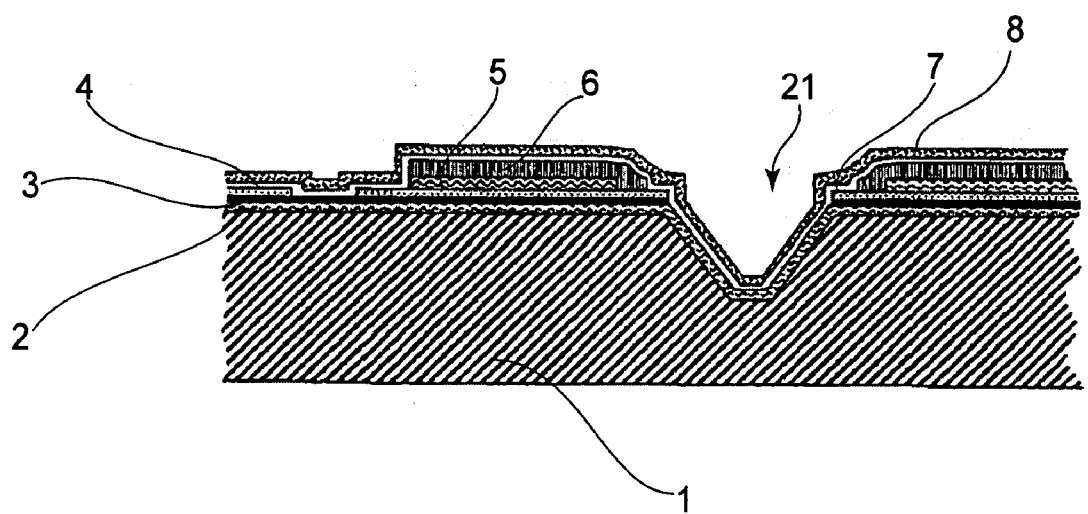
FIG. 6 is a sectional view of the precursor of the semiconductive element shown in FIG. 1, showing the semiconductive element manufacturing step following the step shown in FIG. 5.
Figure 7:
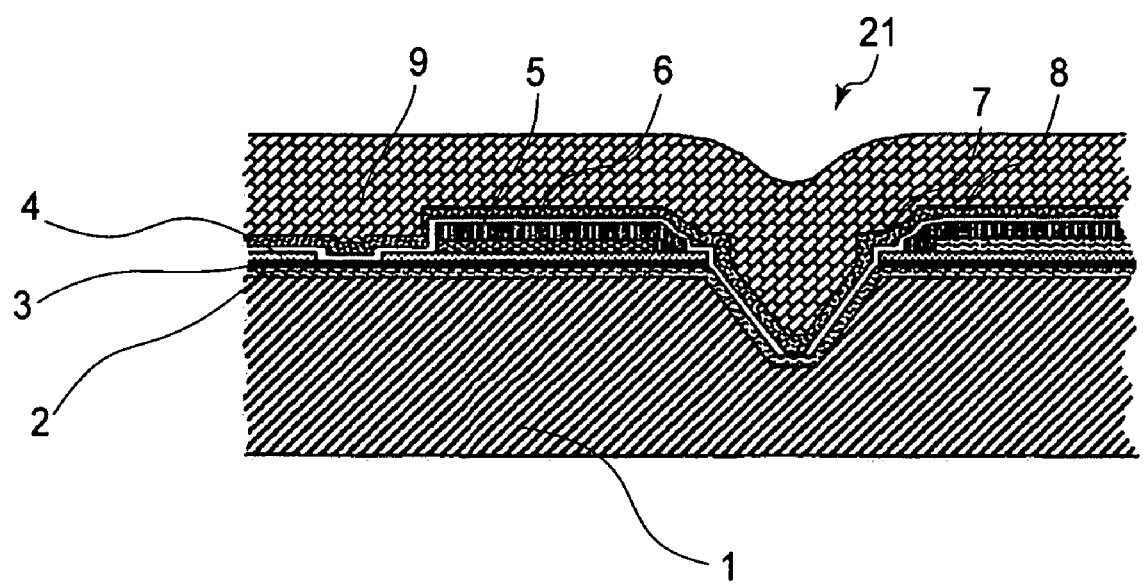
FIG. 7 is a sectional view of the precursor of the semiconductive element shown in FIG. 1, showing the semiconductive element manufacturing step following the step shown in FIG. 6.
Figure 8:
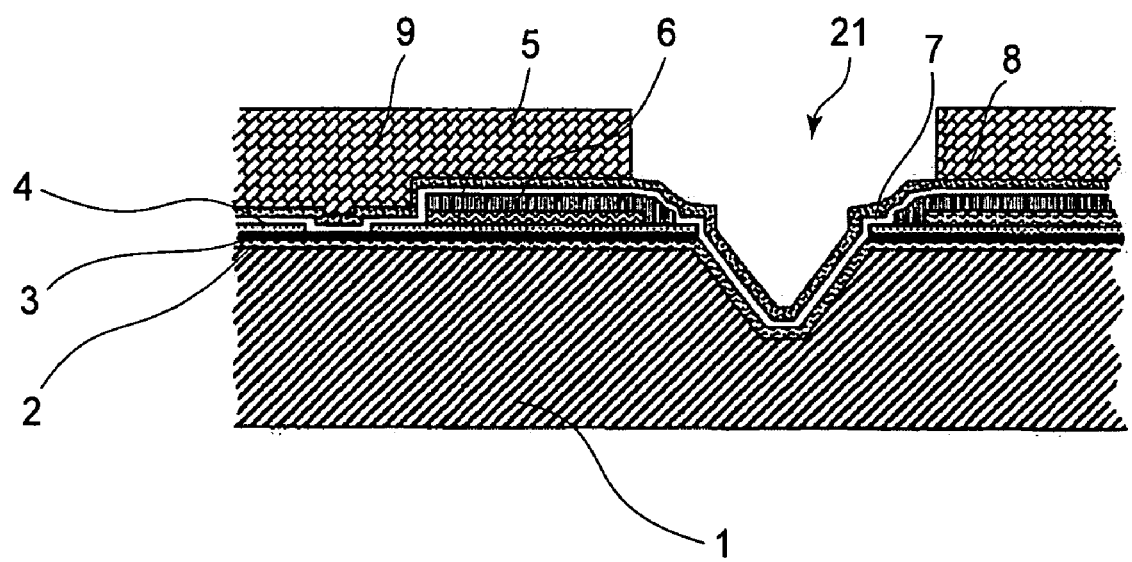
FIG. 8 is a sectional view of the precursor of the semiconductive element shown in FIG. 1, showing the semiconductive element manufacturing step following the step shown in FIG. 7.

Next, referring to FIG. 5, a contact improvement layer 7 is formed of a metallic substance such as TiW which is high in melting point, across the entirety of the top surface of the precursor of the semiconductive element 20, with the use of the thin film depositing method such as the vacuum evaporation method. Then, a thin layer of plating gold 8, which is excellent as a wiring material, is formed on the contact improvement layer 7 as shown in FIG. 6. Then, a layer of photoresist is formed on the thin layer of plating gold 8 as shown in FIG. 7. The photoresist layer 9 is rendered greater in thickness than the preset value to which a thick layer of plating gold 10 will be grown later. Then, the portion of the photoresist layer 9, which coincides with where the connective electrode 10 will be formed, and the portion of the photoresist layer 9, which coincides with the grooves 21, are removed with the use of the pattern formed by the photolithography as shown in FIG. 8.

Figure 9:
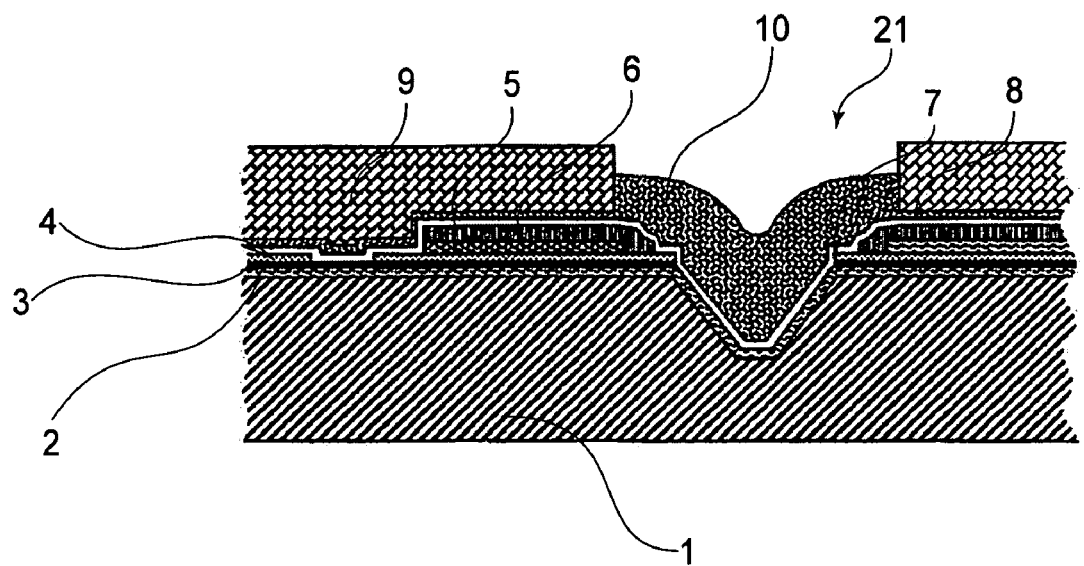
FIG. 9 is a sectional view of the precursor of the semiconductive element shown in FIG. 1, showing the semiconductive element manufacturing step following the step shown in FIG. 8.
Figure 10:
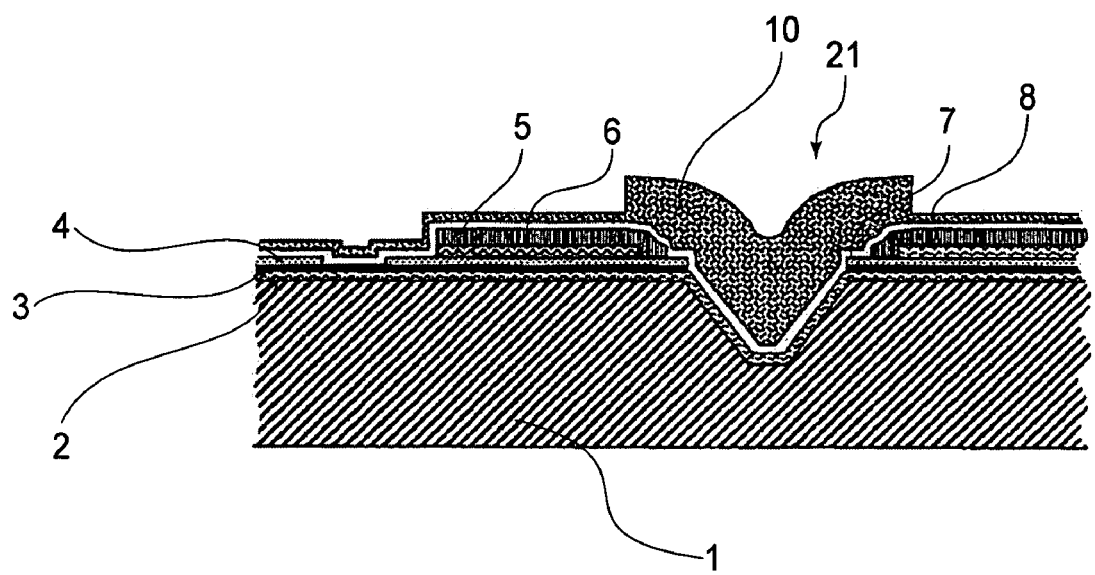
FIG. 10 is a sectional view of the precursor of the semiconductive element shown in FIG. 1, showing the semiconductive element manufacturing step following the step shown in FIG. 9.
Figure 11:
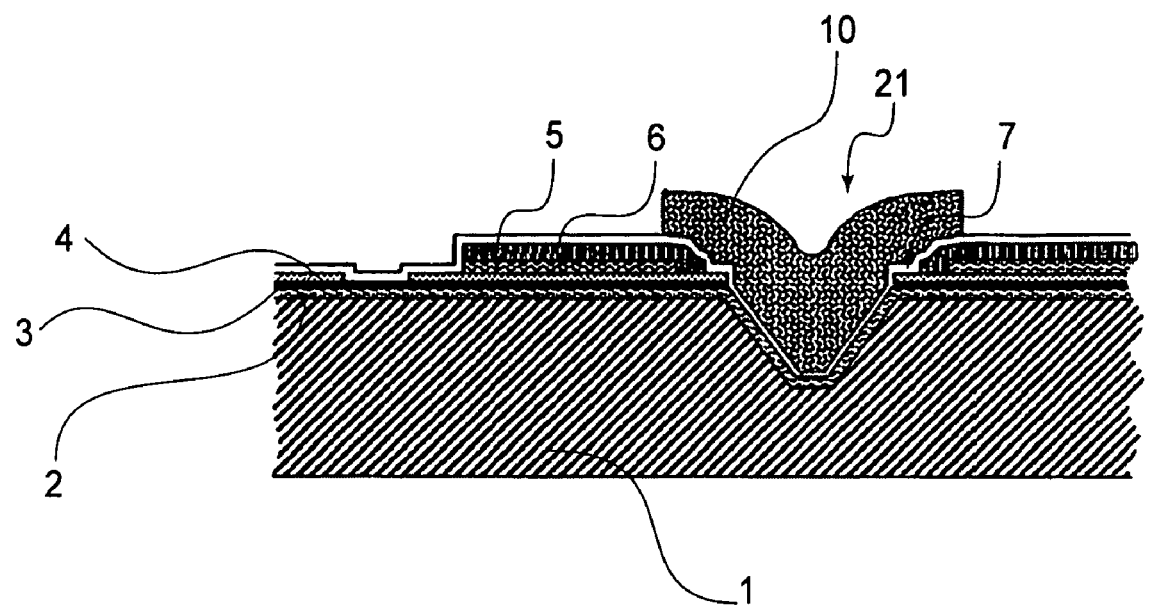
FIG. 11 is a sectional view of the precursor of the semiconductive element shown in FIG. 1, showing the semiconductive element manufacturing step following the step shown in FIG. 10.
Figure 12:
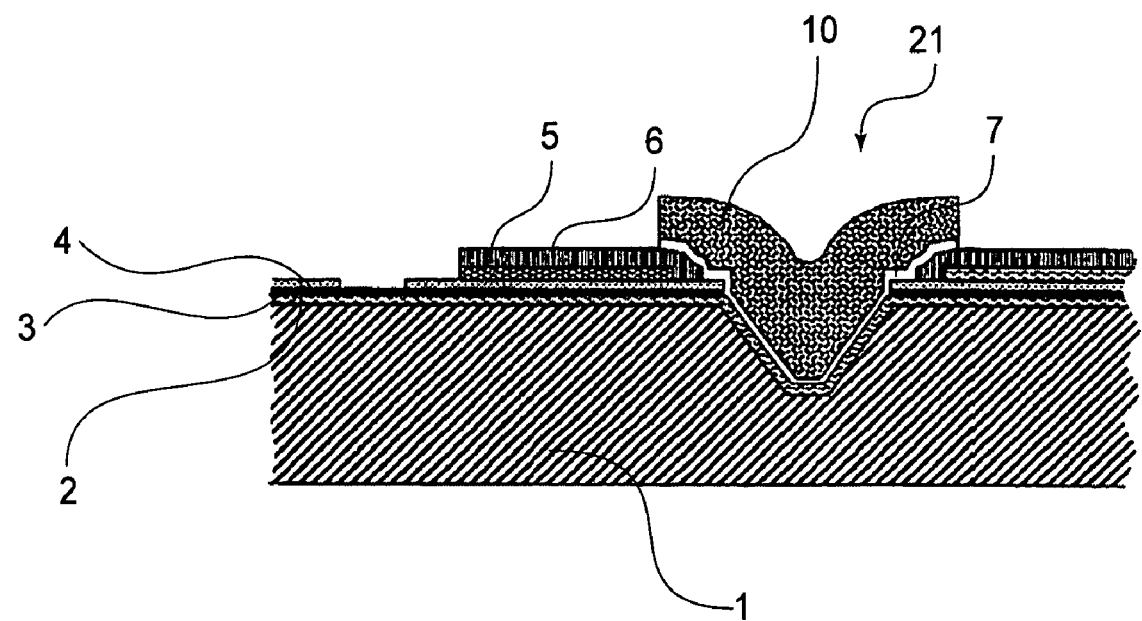
FIG. 12 is a sectional view of the precursor of the semiconductive element shown in FIG. 1, showing the semiconductive element manufacturing step following the step shown in FIG. 11.

Next, referring to FIG. 9, the thick layer of plating gold 10 is formed by electrolytic plating (electric current is flowed through the thin layer of plating gold 8 to precipitate gold), on the substrate 1, across the area which has not been covered with the photoresist layer 9. Then, the photoresist layer 9 is removed to expose the thin layer of plating gold 8 as shown in FIG. 10. Then, the thin layer of plating gold 8 is etched with iodine, exposing thereby the contact improvement layer 7 formed of TiW or the like, as shown in FIG. 11. Next, TiW (contact improvement layer 7) is etched with a solvent which contains hydrogen peroxide, leaving thereby the contact improvement layer 7 (formed of TiW or the like) and layer of plating gold layer 10, only across where the connective electrode 10 will be, as shown in FIG. 12; in other words, this thick layer of plating gold 10 constitutes the connective electrode.

Figure 13:
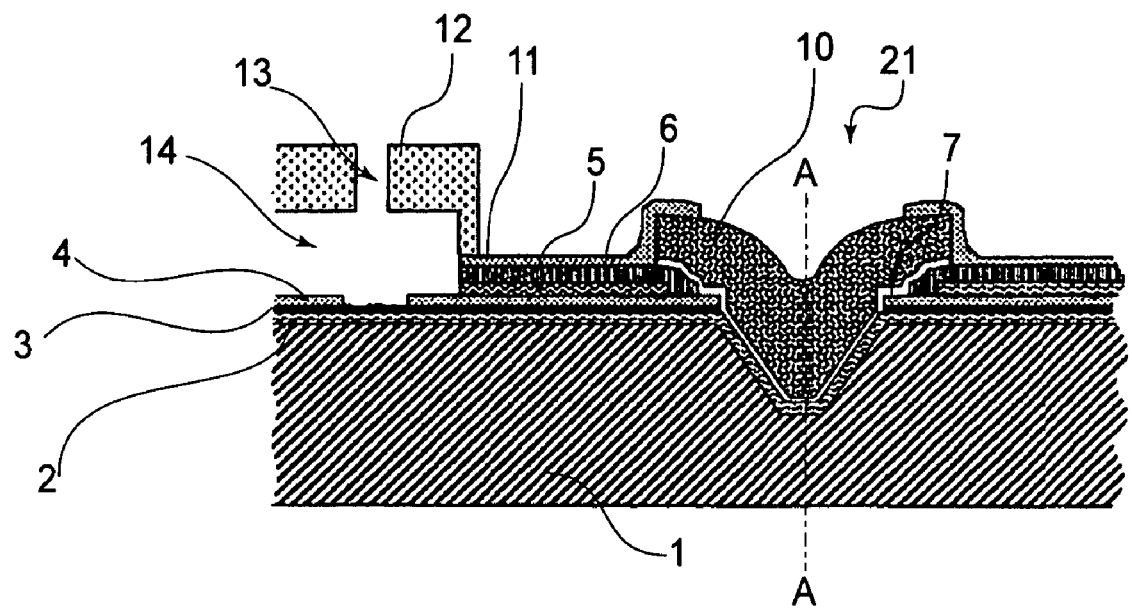
FIG. 13 is a sectional view of the precursor of the semiconductive element shown in FIG. 1, showing the semiconductive element manufacturing step following the step shown in FIG. 12.

Referring to FIG. 13, when the thus obtained semiconductive element 20 is used as the substrate for an ink jet head, first, organic films 11 and 12 are formed on the semiconductive element 20, and an ink ejection orifice 13 and ink passage 14 are formed through the organic film 12. The ink ejection orifice 13 is formed so that it is directly above the heat generating resistor 3, and also, so that it is connected to the ink passage 14.

Next, the wafer is cut with a dicing apparatus or the like, along the scribe line A (cutting line) which coincides with the bottom of the groove formed during the initial steps of the manufacturing process.

With the use of the above described semiconductive element manufacturing process, multiple semiconductive elements 20 are manufactured using each piece of wafer. Referring to FIG. 1, an external wiring substrate (electrically conductive external member), for example, the TAB lead 16, on which a preset pattern has been formed, is placed in contact with the connective electrode 10 of each of these semiconductive elements 20, establishing electrical connection between the semiconductive element 20 and the external wiring substrate. This yields the ink jet head substrates.

Figure 14:
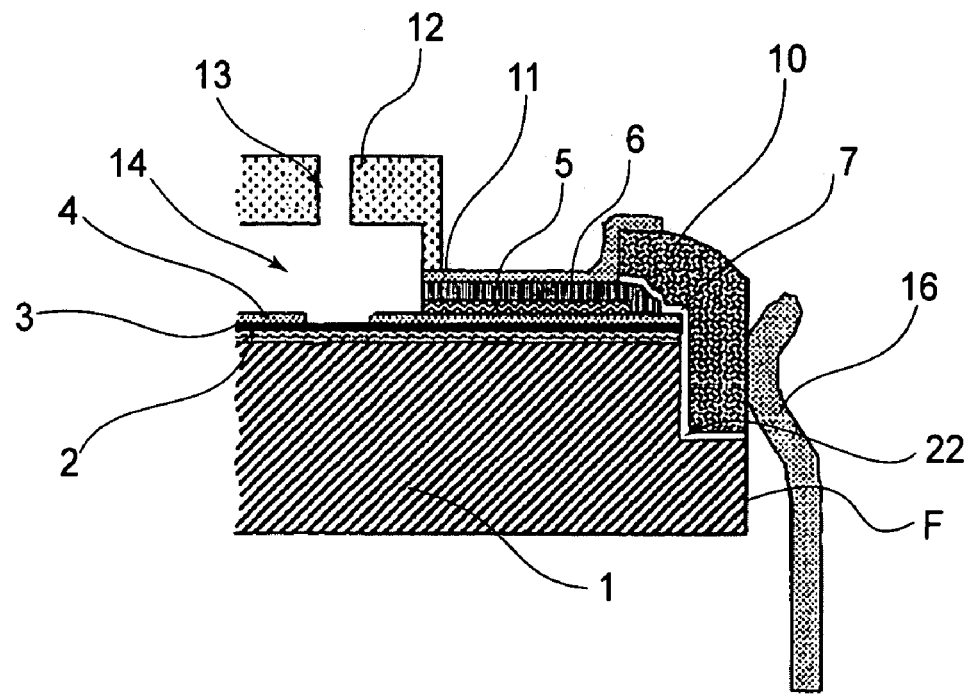
FIG. 14 is a sectional view of the essential portions of one of the modifications of the semiconductive element in the first embodiment of the present invention.

FIG. 14 shows one of the modifications of the ink jet substrate in this embodiment. In the case of the ink jet head substrate shown in FIG. 1, the connective electrode 10 is attached to the slanted surface of the silicon substrate, the angle of which relative to the top surface of the silicon substrate is roughly 54°, as described above. In the case of the ink jet head substrate shown in FIG. 14, that is, the modified version of the ink jet head substrate shown in FIG. 1, when forming the groove 21, the groove 21 is formed so that the side walls 22 of the groove 21 become perpendicular to the top surface of the silicon substrate 1. Thus, the connective electrode 10 of this modified version is attached to one of the two vertical side walls of the groove 21, and the flat bottom surface of the groove 21. As for the method for forming the groove 21 with the vertical side walls 22, it may be such a wet etching method that takes into consideration the crystalline plane orientation, or anisotropic dry etching. Further, it may be mechanical method such as sand blasting.

According to this embodiment, the bump and lead wire, which are for establishing electrical connection, are unnecessary. Therefore, the ink jet head substrate can be reduced in manufacturing cost and number of manufacturing steps, and also, the process for manufacturing the ink jet head substrate becomes very simple. Further, the connective electrode 10 is exposed at one of the outermost lateral surfaces F (surfaces resulting from cutting of wafer) of the semiconductive element 20, and the connective surface of the connective electrode 10 is level with the outermost lateral surface F; in other words, the connective surface of the connective electrode 10 does not protrude beyond the outermost lateral surface F, making it possible to dispose the semiconductive element 20 at a higher level of density to achieve a higher level of spatial efficiency.

Embodiment 2

Figure 15:
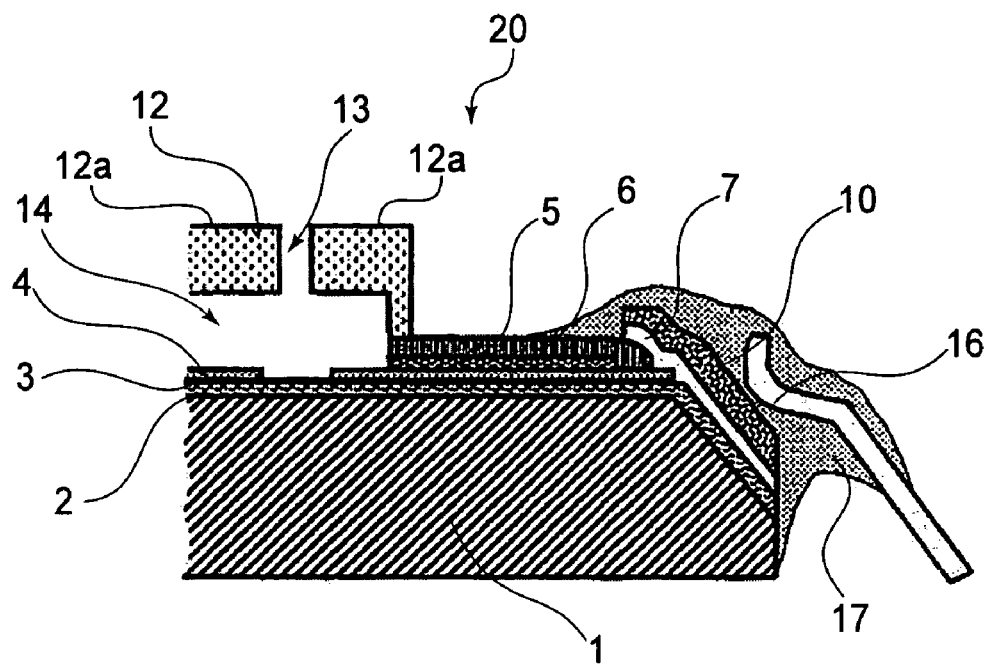
FIG. 15 is a sectional view of the essential portions of the semiconductive element in the second embodiment of the present invention.

The second embodiment of the present invention shown in FIG. 15 relates to the structural arrangement for solving one of the essential problems from which an ink jet head suffers, that is, the structural arrangement for preventing ink from coming into contact with the connective electrode 10. More specifically, the structural arrangement is such that the connective electrode 10 is protected by being covered with a seal 17. Otherwise, the semiconductive element in this embodiment is the same in structure as that in the first embodiment. Therefore, the portions of the semiconductive element in this embodiment similar to those in the first embodiment are given the same referential symbols as those given to the corresponding portions in the first embodiment, and will not be described.

The seal 17 is for protecting the connective electrode 10 so that ink does not come into contact with the connective electrode 10. In most cases, it is provided to prevent ink as electrolyte from corroding or melting the connective electrode 10 by directly coming into contact with the connective electrode 10. In the case of the semiconductive element 101 in accordance with the prior art shown in FIG. 28, as the seal 109 is formed to protect the ball bump 103 and connective electrode 102, the seal 109 protrudes beyond the top surface 110 where the ink ejection orifice 108 is open. Thus, the gap between the ink ejection orifice 108, and a sheet of recording medium (unshown) which faces the ink ejection orifice 108, must be increased by the amount equal to the distance by which the seal 109 projects beyond the top surface 110. The increase in this gap exacerbates the amount by which an ink droplet ejected from the ink ejection orifice 108 misses the correct landing point on the recording medium, making it thereby impossible to record in a desired manner; it is possible that an image may suffer from such image defect as a streaky blank portion that results because ink fails to land on intended points. In particular, in order to make easier the operation for attaching the ball bump 103, the ball bump 103 is attached to the connective electrode 102, on the surface which faces the same direction (upward in FIG. 28) as the surface 110 having the ink ejection orifice 108, and then, it is connected to the electrically conductive external member 104. Then, the seal 109 is placed in a manner of covering the ball bump 103, electrically conductive external member 104, and their adjacencies. Thus, the presence of the ball bump 103 raises the peak of the seal 109. In other words, the presence of the ball bump 103 moves the peak of the seal 109 toward the area where the recording medium is present while recording is made on the recording medium. Therefore, in the case of this structural arrangement, the seal 109 is likely to protrude beyond the surface 110 having the ink ejection orifice 108, toward the area where the recording medium will be present; the seal 109 is likely to protrude upward beyond the surface 110.

In this embodiment, therefore, an attempt is made to improve the recording apparatus in reliability, by employing the structural arrangement in which the seal 17 does not protrude beyond the surface 12a at which the ink ejection orifice is open (seal 17 is positioned lower than surface 12a).

The semiconductive element in this embodiment is manufactured through the same steps as those in the first embodiment, which are shown in FIGS. 3-13. That is, the electrically nonconductive separation film layer 2, heat generating resistor layer 3, aluminum wiring layer 4, an electrically nonconductive separation film layer 5, protective film layer 6, contact improvement layer 7, thin layer of plating gold 8, photoresist layer 9, and thick layer of gold 10 are sequentially formed, and the patterning and removing processes are carried out as necessary. Then, the organic film 12 having the ink ejection orifice 13 and ink passage 14 is formed. Then, the wafer and the elements thereon are cut with a dicing apparatus or the like, along the scribe lines A (cutting line) which coincide with the grooves 21 having been formed in the earlier step, yielding the semiconductive elements 20. Next, referring to FIG. 1, the external wiring substrate (electrically conductive external member) such as the TAB lead 16 or the like, on which a preset pattern has been formed, is connected to the connective electrode 10 of the thus obtained semiconductive element 20, completing the substrate for an ink jet head. Thereafter, the joint between the connective electrode 10 and electrically conductive external member, and its adjacencies, are coated with the seal 17 to protect the connective electrode 10 as shown FIG. 15.

Figure 16:
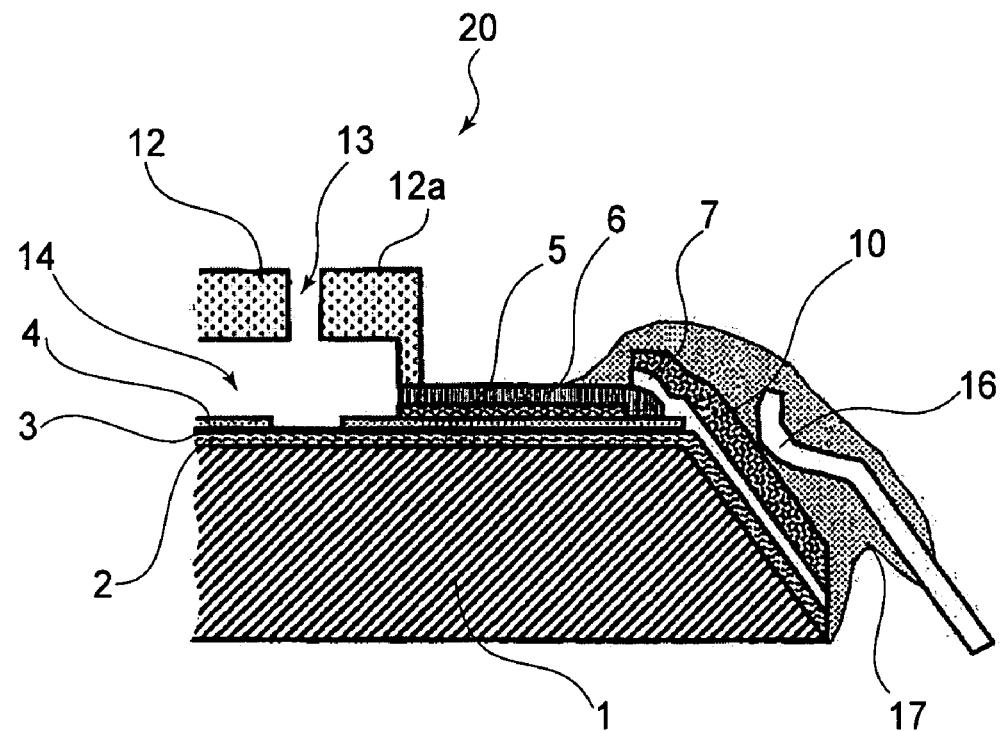
FIG. 16 is a sectional view of the essential portions of one of the modifications of the semiconductive element in the second embodiment of the present invention.
Figure 17:
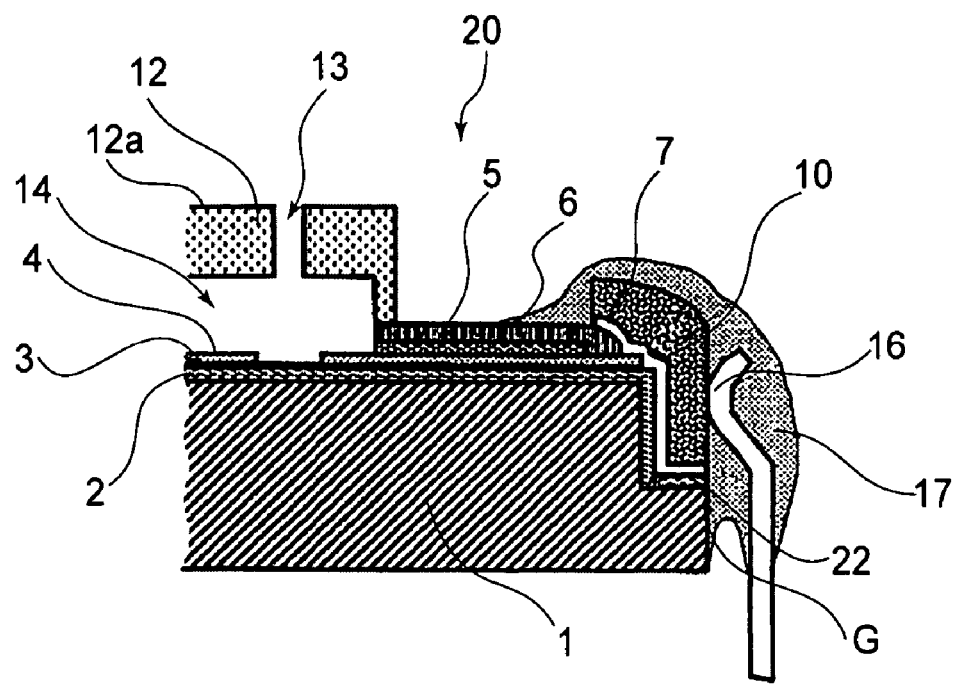
FIG. 17 is a sectional view of the essential portions of another modification of the semiconductive element in the second embodiment of the present invention.
Figure 18:
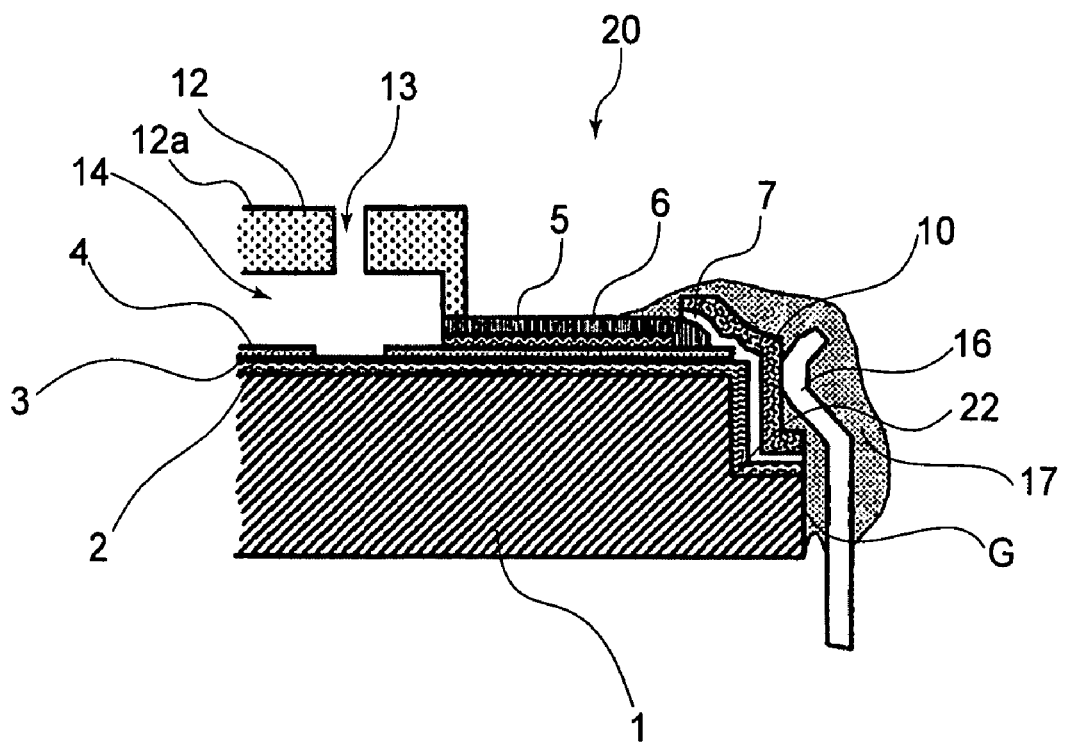
FIG. 18 is a sectional view of the essential portions of another modification of the semiconductive element in the second embodiment of the present invention.
Figure 19:
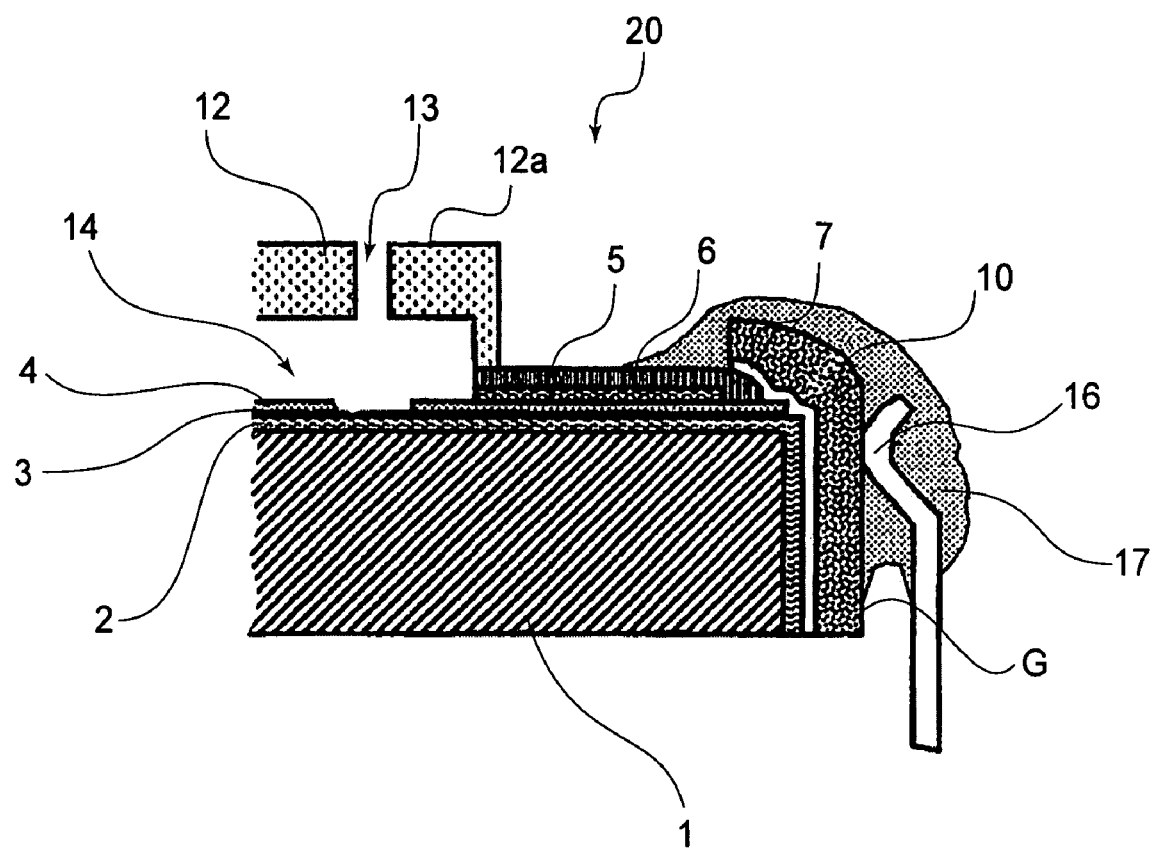
FIG. 19 is a sectional view of the essential portions of another modification of the semiconductive element in the second embodiment of the present invention.

FIGS. 16-19 show other modifications of this embodiment. The connective electrode 10 of the semiconductive element 20 shown in FIG. 15 is attached to the same location of the semiconductive element 20 as that in the first embodiment; it is attached to one of the slanted lateral surfaces of the silicon substrate. The semiconductive element 20 shown in FIG. 16 is different from the semiconductive element 20 shown in FIG. 15 in that the former is longer in the slanted surface than the latter. The semiconductive element 20 shown in FIG. 17 is similar to the modified version, shown in FIG. 14, of the semiconductive element 20 in the first embodiment, in that the lateral wall of the substrate, to which the connective electrode 10 is attached, is provided with a rabbet (recess) having the vertical cheek 22 (wall). The semiconductive element 20 shown in FIG. 18 is different from that shown in FIG. 17 in that the connective electrode 10 of the former is thinner than that of the latter. Further, the semiconductive element 20 shown in FIG. 19 is unique in that the cheek of the rabbet (recess), with which the lateral wall of its substrate is provided to attach the connective electrode 10 to the substrate, is perpendicular to the drawing (FIG. 19 shows cross section of connective electrode filled in rabbet (recess). Within the portion of the semiconductive element 20 shown in FIG. 19, the surface G of the semiconductive element 20, that is, one of the lateral surfaces which result as the wafer and the elements thereon are cut, is the surface of the connective electrode 10 itself, which results as the connective electrode 10 is cut when the wafer and the elements thereon are diced to separate multiple individual semiconductive elements 20 on the wafer.

Figure 28:
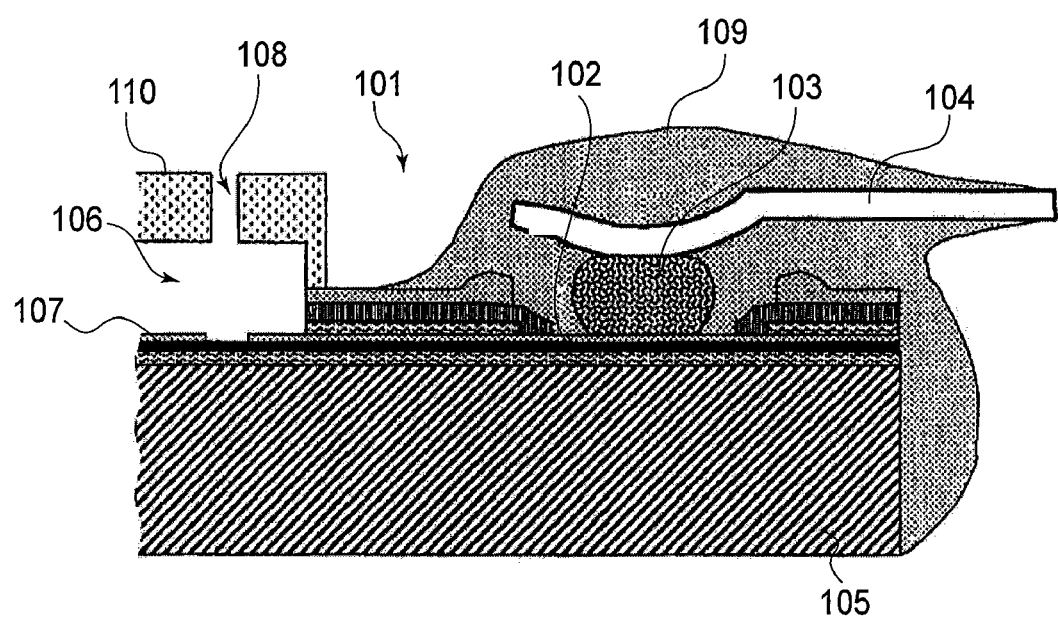
FIG. 28 is a sectional view of the seal which covers the joint between the ball bump of the semiconductive element in accordance with the prior art, and the electrically conductive external member.

The structure of the semiconductive element 20 in this embodiment is different from that of the semiconductive element in accordance with the prior art shown in FIG. 28, in that the seal 17 which covers the connective electrode 10 is positioned inward of the semiconductive element relative to the organic film surface 12a having the ink ejection orifice 13 (on substrate side, that is, downward of drawing), that is, positioned lower than the surface 12a. Therefore, not only can the same effects as those obtained by the first embodiment be obtained, but also, it is possible to obtain the effect that the distance between the ink ejection orifice 13 and recording medium does not need to be unnecessarily widened.

Further, this embodiment eliminates the need for the ball bump 103. Therefore, the connective electrode 10 can be placed on the lateral surface G, which is perpendicular to the surface 12a having the ink ejection orifice 103, because it is unnecessary to take into consideration the operation for attaching the ball bump 103. Further, the absence of the ball bump 103 makes it possible to reduce the seal 17 in height. Therefore, in the case of the structural arrangement in this embodiment, the seal 17 does not protrude beyond the surface 12a having the ink ejection orifice 13. Therefore, the ink jet head employing the ink jet head substrate in this embodiment is superior in terms of the accuracy with which the liquid ink droplets ejected from the ink ejection orifice land on the recording medium, being therefore capable of recording at a higher level of quality.

Incidentally, in this embodiment, the organic film 11 is absent. That is, the organic film 11 may be absent, because the ink ejection orifice 13 and ink passage 14 can be formed with the organic film 12 alone.

Embodiment 3

The semiconductive element 23 in the third embodiment of the present invention, shown in FIGS. 20(a) and 20(b), is made up of multiple (two, for example) semiconductive chips 23a joined together. These semiconductive chips 23a are provided with a connective portion 18 (edge) having multiple connective projections (plugs) aligned with preset intervals, and/or a connective portion 18 (edge) having multiple recesses (sockets) aligned with preset intervals, so that as the adjacent two semiconductive chips 23a are engaged at their connective portions 18, not only are the two semiconductive chips 23a mechanically connected, but also, electrical connection is established between the two. FIG. 20(a) shows the essential portions of the two semiconductive chips 23a prior to their engagement, and FIG. 20(b) shows the semiconductive element 23, that is, the two semiconductive chips 23a which have been engaged. FIGS. 20(a) and 23 are the cross-sectional views of semiconductive element 23 at the line D-D in FIG. 22(a).

Figure 20:
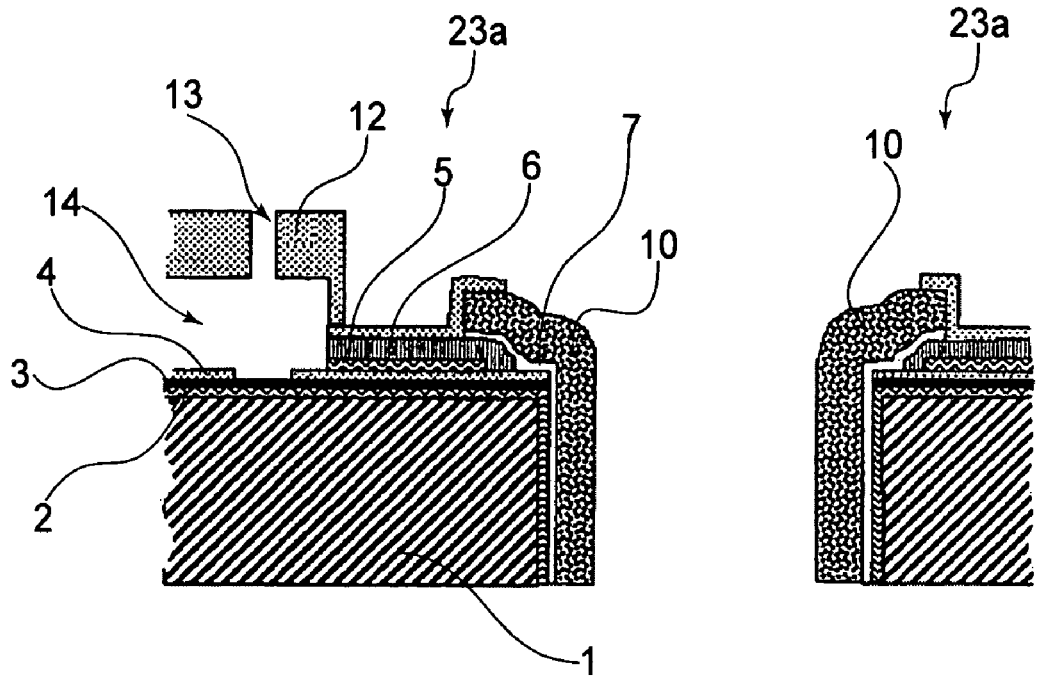
FIG. 20(a) is a sectional view of the essential portions of the two semiconductive chips in the third embodiment of the present invention, in which the two semiconductive chips are yet to be connected.
FIG. 20(b) is a sectional view of the essential portions of the two semiconductive elements (shown in FIG. 20(a), in which the two semiconductive elements have been connected.
Figure 20:
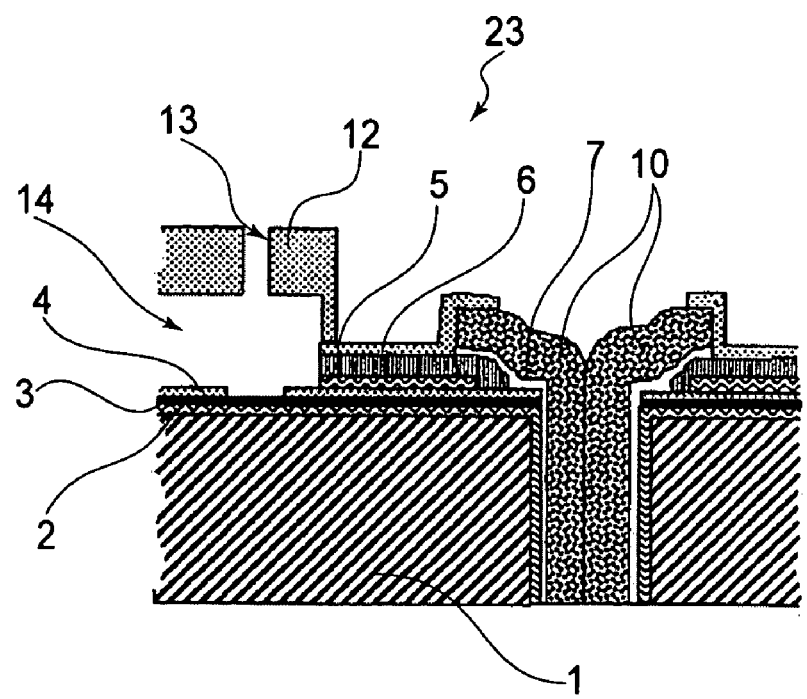
Figure 21:
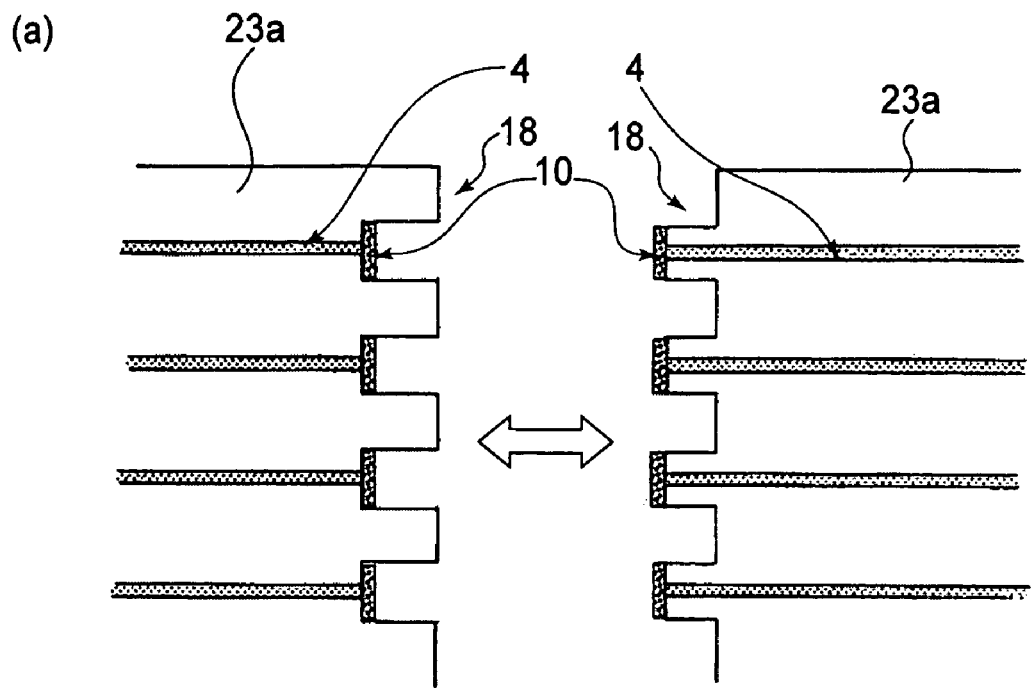
FIG. 21(a) is a schematic plan view of the essential portions of the two semiconductive chips (shown in FIG. 20), in which the two semiconductive chips are yet to be connected.
FIG. 21(b) is a schematic plan view of the essential portions of the two semiconductive chips (shown in FIG. 20), in which the two semiconductive chips have been connected.
Figure 21:
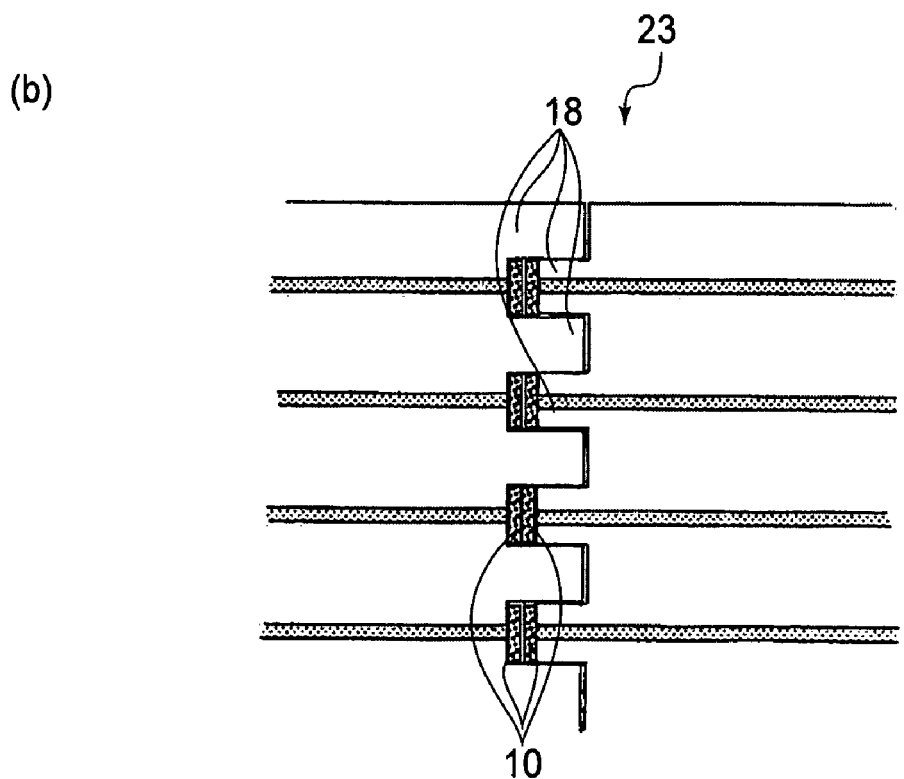

Referring to FIGS. 20 and 21, in this embodiment, multiple (two, for example) semiconductive chips 23a manufactured through the same steps as those described above are joined together at their connective portions 18, which are the edge portions of the semiconductive chips 23a and have the connective electrode 10. That is, the substrate of the semiconductive chip 23a, which includes the silicon substrate 1, is shaped so that one of the opposing two edge portions has the abovementioned multiple projections, and the other has the abovementioned multiple recesses. Then, the connective electrode 10 is formed on the tip of each projection and each recess. Thus, as the two semiconductive chips 23a are engaged by their connective portions (edge portions) to form the semiconductive element 23, not only do the two semiconductive chips 23a become physically connected, but also, electrical connection is established between the connective electrodes 10 of the two semiconductive chips 23a.

Figure 22:
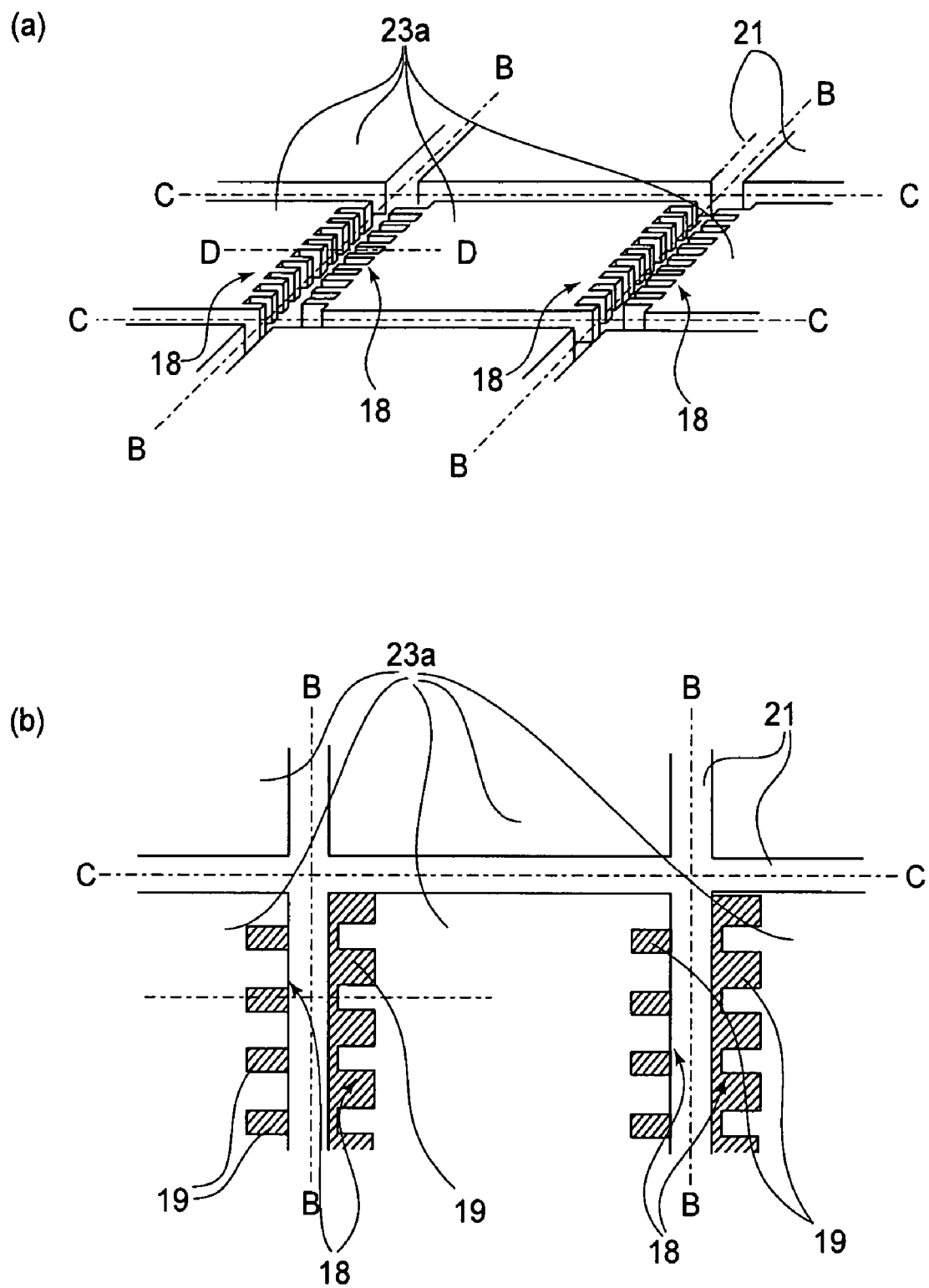
FIG. 22(a) is a schematic perspective view of the grooves, which are cut in the surface of the silicon substrate, and along which the substrate is cut, when forming the semiconductive chip shown in FIG. 20.
FIG. 22(b) is a schematic plan of the grooves, showing the process for forming the grooves.
Figure 23:
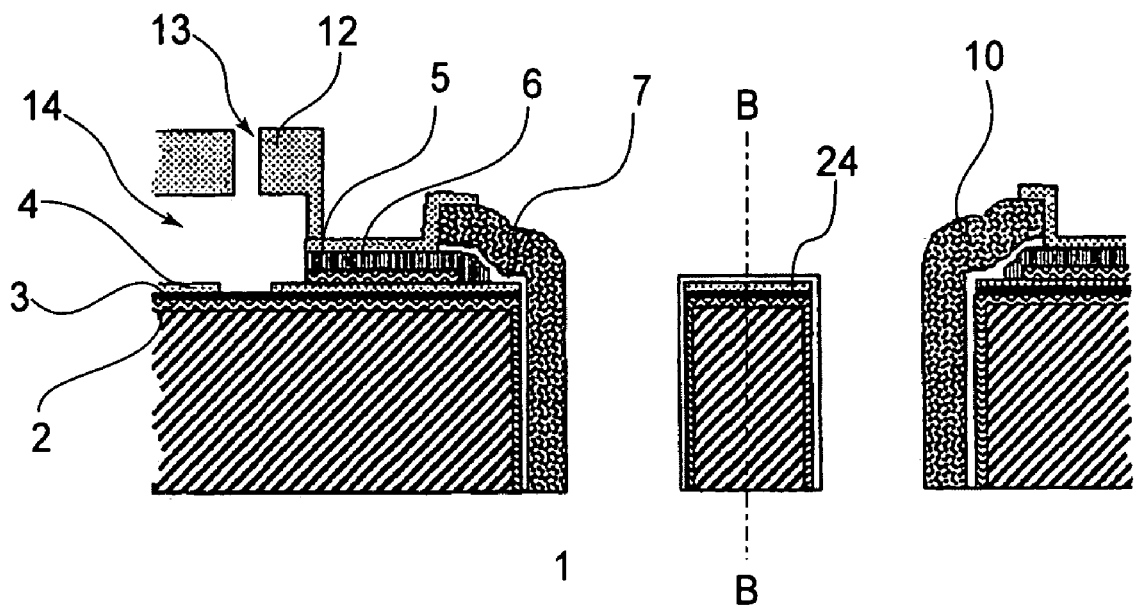
FIG. 23 is a sectional view of the precursor of the semiconductive chip shown in FIG. 20, showing one of the steps of the process for manufacturing the semiconductive chip.

In this embodiment, multiple semiconductive chips 23a are formed on a single piece of wafer as shown in FIG. 22. Then, the wafer is diced to obtain multiple individual semiconductive chips 23a. More specifically, the grooves 21 are formed in the surface of the silicon substrate 1 so that the bottom of each groove 21 coincides with the corresponding scribe line B or C (cutting line) which is between the adjacent two semiconductive chips 23a. Then, the silicon substrate 1 is covered with the mask 19 and is dry etched with CF4, giving the silicon substrate 1 a desired shape (in terms of top view) for the semiconductive chip 23a, that is, the shape that has the multiple projections (plug portions) along one of the opposing edge portions, and multiple recesses (socket portions) along the other.

Next, through the same steps as those, shown in FIGS. 3-13, used to form the semiconductive element 20 in the first embodiment, the electrically nonconductive separation film layer 2, heat generating resistor layer 3, aluminum wiring layer 4, electrically nonconductive separation film layer 5, protective film layer 6, contact improvement layer 7, thin layer of plating gold 8, photoresist layer 9, and thicker layer of plating gold 10 are sequentially formed, and the patterning and removing processes are carried out as necessary. Then, the organic film 12 having the ink ejection orifice 13 and ink passage 14 is formed.

Next, the silicon substrate 1 and the elements thereon are cut with a dicing apparatus or the like, along the scribe lines B and C (cutting lines) which coincide with the grooves 21 formed in the earlier step. Although FIG. 23 shows only the scribe lines B, the silicon substrate 1 and the elements thereon are cut along the scribe lines B and C. Further, the portion 24 (FIG. 23) which is in the groove 21 is removed at the same time as the dicing along the scribe lines B. The semiconductive chips 23 are completed through the steps described above.

Using a single piece of wafer, multiple semiconductive chips 23a are manufactured through the above described steps. Each of the thus obtained semiconductive chips 23a is shaped (in terms of top view) so that one of the opposing two edge portions 18 has the multiple projections (plug portions) and the other edge portion 18 has the multiple recesses (socket portions), making it possible to engage the semiconductive chip 23a with another semiconductive element 23 along the corresponding edge portions 18. With the provision of this structural arrangement, as the two semiconductive chips 23a are engaged at their connective portions 18 as shown in FIGS. 20 and 21, not only do the two semiconductive chips 23a become mechanically connected, but also, the connective electrodes 10 of the two semiconductive chips 23a come into contact with each other, establishing electrical connection between the two semiconductive chips 23a, completing thereby the semiconductive element 23. Since the projections (plug portions) of the connective portions 18 of one of the two semiconductive chips 23a are engaged into the recesses (socket portions) of the connective portion 18 of the other semiconductive chip 23a, not only are the mechanical connection and electrical connection achieved at the same time, but also, the connections are more reliable. For the purpose of further ensuring the reliability of the connection between the connective electrodes 10 of one of the two semiconductive chips 23a and the connective electrodes 10 of the other, the joint portions of the two connective electrodes may be partially heated, or the connective electrodes of the former may be partially welded to those of the latter by ultrasonic waves or the like, after the two semiconductive chips 23a are engaged at their connective portions 18.

Also in the case of this embodiment, the bump and lead wire, which are for establishing electrical connection, are unnecessary. Therefore, the ink jet head substrate can be reduced in manufacturing cost and number of manufacturing steps, and also, the process for manufacturing the ink jet head substrate becomes very simple. Further, the connective surface of the connective electrode 10 of the semiconductive chip 23a is level with the outermost lateral surface (surface resulting from dicing of silicon substrate and elements thereon) of the semiconductive chip 23a, or the connective surface of the connective electrode 10 is positioned inward of the semiconductive chip 23a relative to the outermost surface of the semiconductive chip 23a. Therefore, it possible to dispose the semiconductive chips 23a at a higher level of density to achieve a higher level of spatial efficiency.

Figure 24:
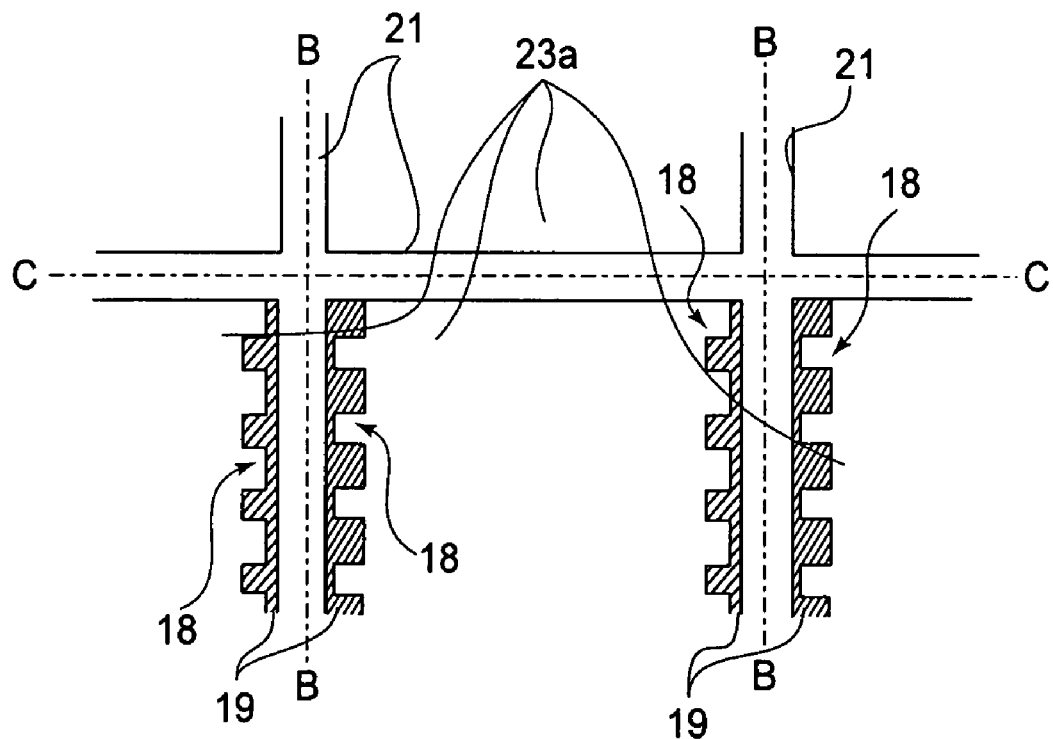
FIG. 24 is a schematic plan view of the grooves, which are cut in the surface of the silicon substrate, and along which the substrate is cut, when forming one of the modifications of the semiconductive chip in the third embodiment of the present invention.
Figure 25:
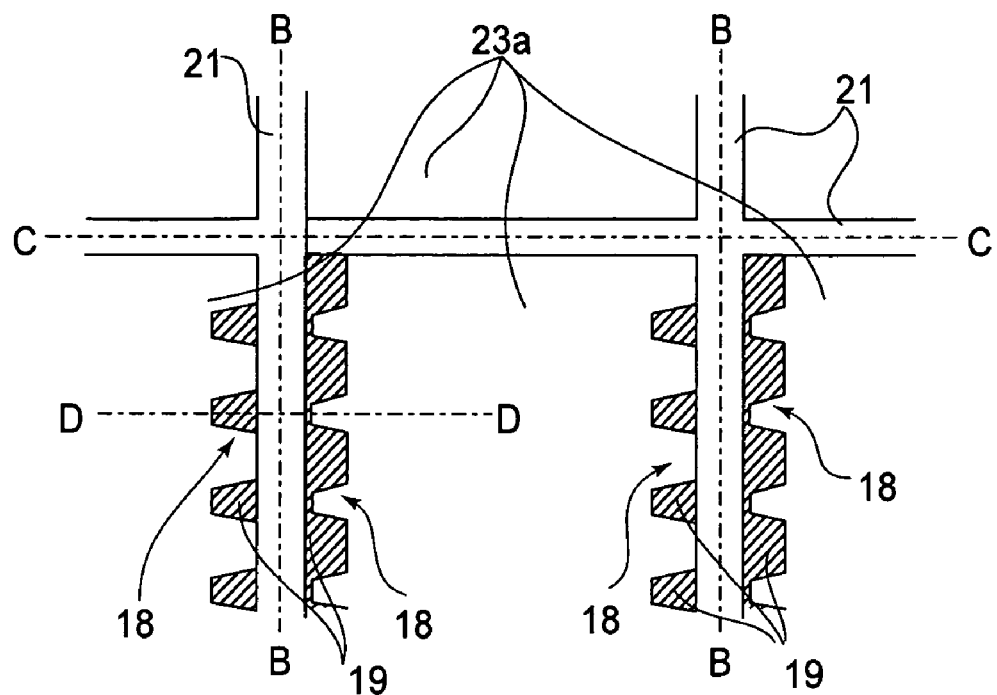
FIG. 25 is a schematic plan view of the grooves, which are cut in the surface of the silicon substrate, and along which the substrate is cut, when forming another modification of the semiconductive chip in the third embodiment of the present invention.
Figure 26:
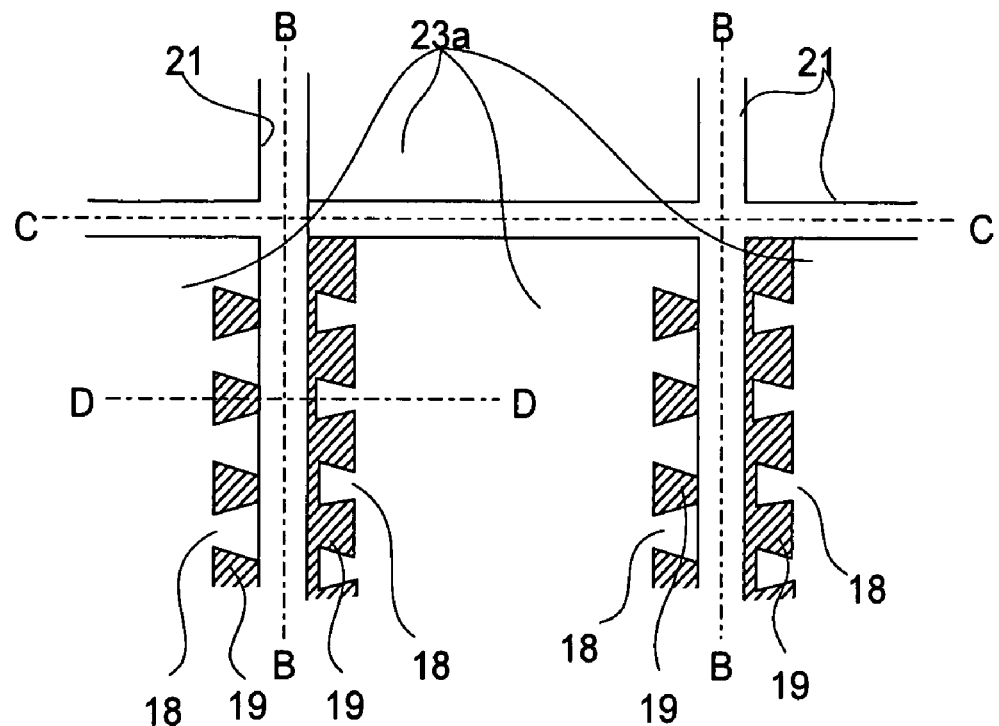
FIG. 26 is a schematic plan view of the grooves, which are cut in the surface of the silicon substrate, and along which the substrate is cut, when forming another modification of the semiconductive chip in the third embodiment of the present invention.
Figure 27:
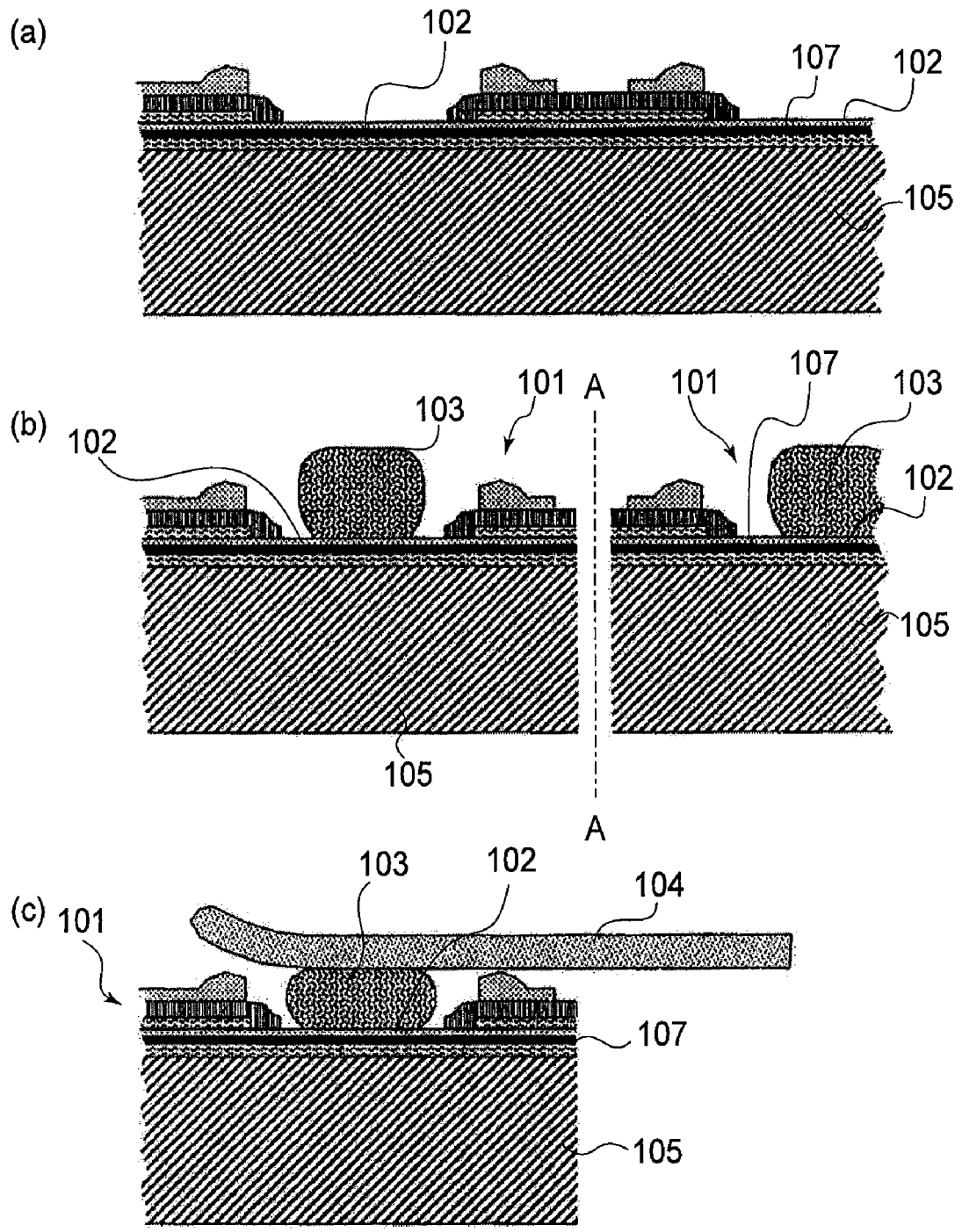
FIG. 27(a) is a sectional view of the essential portions of two precursors of a semiconductive elements in accordance with the prior art, showing one of the steps of the process for forming multiple semiconductive elements on a single piece of silicon substrate.
FIG. 27(b) is a sectional view of the essential portions of the two precursors of the semiconductive elements, showing the step for cutting the silicon substrate after the formation of the ball bumps on the semiconductive elements.
FIG. 27(c) is a sectional view of the completed semiconductive element, to the ball bump of which an electrically conductive external member has been connected.

FIGS. 24-26 are plan views of the essential portions of the modifications of the connective portions of the semiconductive chip 23a in this embodiment. FIGS. 24-26 correspond to FIG. 22(b). The modification shown in FIG. 24 is different from the semiconductive chip 23a in this embodiment in that the projections (plug portions) and recesses (socket portions) are rendered different in dimension (in terms of width direction of chip). In the case of the modification shown in FIG. 25, the projections are tapered so that they are narrower at the tip than at the base, making it easier to engage the projections into the recesses. In the case of the modification shown in FIG. 26, the projections are tapered so that they are wider at the tip than at the base (dove tailed), mechanically minimizing the possibility that the two semiconductive chips 23a will separate from each other. The various shapes of these connective portions 18 can be realized by changing the pattern in which the masks are formed by anisotropic dry etching to form the grooves in the surface of the silicon substrate 1. Obviously, the shape of the connective portion 18 does not need to be limited to the abovementioned ones; it is optional.

In this embodiment, multiple semiconductive chips 23a, which are identical, are formed using a single piece of wafer, and then, they are joined. However, the present invention is also applicable to a case in which multiple semiconductive elements 23a of one type, for example, driver chips, are formed using a single piece of wafer, whereas multiple semiconductive elements 23a of another type, for example, logic chips, are formed on another piece of wafer, and then, one of the former is integrally joined with one of the latter.

The preceding embodiments of the present invention were described with reference to the case in which a semiconductive element is used as the substrate for an ink jet head. However, the usage of a semiconductive element in accordance with the present invention is not limited to the above described one; the present invention is applicable to the structural arrangement for establishing electrical connection between a semiconductive element and another component (components) in various apparatuses which employ a semiconductive element.

While the invention has been described with reference to the structures disclosed herein, it is not confined to the details set forth, and this application is intended to cover such modifications or changes as may come within the purposes of the improvements or the scope of the following claims.

This application claims priority from Japanese Patent Application No. 023716/2005 filed Jan. 31, 2005, which is hereby incorporated by reference herein.

What is claimed is:

1. A manufacturing method for manufacturing semiconductor devices by cutting a silicon substrate having the semiconductor devices formed thereon, said method comprising:

a step of forming a linear recess in the silicon substrate between adjacent semiconductor devices;

an electrode forming step of forming, on an inner surface of the linear recess, an electrode for external electrical connection of one of the semiconductor devices; and a step of separating the one semiconductor device from at least one of the adjacent semiconductor devices on the silicon substrate by cutting the silicon substrate along the linear recess, wherein said electrode forming step includes a step of forming a metal thin film astride a cutting line at which the silicon substrate is to be cut, a step of forming a resist layer and patterning the resist layer on the metal thin film to remove at least one portion of the resist layer, a step of growing metal at the at least one portion, and a step of removing the patterned resist layer and the metal thin film below the patterned resist layer, wherein the electrode for external electrical connection is provided by the metal grown in the step of growing the metal.

2. A method according to claim 1, wherein when the silicon substrate is cut, a surface forming the electrode for external electrical connection is simultaneously formed.

3. A method for manufacturing an ink jet head, wherein an ink jet head structure is formed on a semiconductor device provided by cutting a silicon substrate, said manufacturing method comprising:

providing semiconductor devices formed on the silicon substrate with energy generating means for generating energy for ejecting ink, an interconnection layer for electrical connection between the energy generating means and a connection electrode, an ink ejection outlet disposed corresponding to the energy generating means, and an ink flow path;

a step of forming a linear recess in a surface of the silicon substrate between adjacent semiconductor devices;

an electrode forming step of forming, on an inner surface of the linear recess, an electrode for external electrical connection of one of the semiconductor devices; and a step of cutting the silicon substrate along the linear recess to separate the one semiconductor device from at least one of the adjacent semiconductor devices on the silicon substrate and to expose the electrode for external electrical connection on a cut surface, wherein said electrode forming step includes a step of forming a metal thin film astride a cutting line at which the silicon substrate is to be cut, a step of forming a resist layer and patterning the resist layer on the metal thin film to remove at least one portion of the resist layer, a step of growing metal at the at least one portion, and a step of removing the patterned resist layer and the metal thin film below the patterned resist layer, wherein the electrode for external electrical connection is provided by the metal grown in said step of growing the metal.

4. A method according to claim 3, farther comprising a step of connecting an external electroconductive member with the electrode for external electrical connection, and a step of providing a sealing material covering a connecting portion between the electrode for external electrical connection and the external electroconductive member, wherein the sealing material is provided so as not to project beyond a surface in which the ink ejection outlet is defined.

* * * * *